(12) United States Patent
Zhu et al.

(10) Patent No.: US 11,784,638 B2
(45) Date of Patent: Oct. 10, 2023

(54) SWITCH CONTROL SYSTEMS FOR LIGHT EMITTING DIODES AND METHODS THEREOF

(71) Applicant: ON-BRIGHT ELECTRONICS (SHANGHAI) CO., LTD., Shanghai (CN)

(72) Inventors: Liqiang Zhu, Shanghai (CN); Jun Zhou, Shanghai (CN)

(73) Assignee: On-Bright Electronics (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 17/503,238

(22) Filed: Oct. 15, 2021

(65) Prior Publication Data

US 2022/0038085 A1 Feb. 3, 2022

Related U.S. Application Data

(60) Division of application No. 16/809,405, filed on Mar. 4, 2020, now Pat. No. 11,183,996, which is a (Continued)

(30) Foreign Application Priority Data

Jul. 10, 2017 (CN) .......................... 201710557179.4

(51) Int. Cl.
*H05B 45/395* (2020.01)
*H05B 45/10* (2020.01)
(Continued)

(52) U.S. Cl.
CPC ............... *H03K 5/24* (2013.01); *H05B 45/10* (2020.01); *H05B 45/3575* (2020.01);
(Continued)

(58) Field of Classification Search
CPC ........ H03K 5/24; H05B 45/395; H05B 45/10; H05B 45/3575; G01R 19/16538; Y02B 20/30
See application file for complete search history.

(56) References Cited

U.S. PATENT DOCUMENTS 3,803,452 A 4/1974 Goldschmied
3,899,713 A 8/1975 Barkan et al.
(Continued)

FOREIGN PATENT DOCUMENTS

CN 1448005 A 10/2003
CN 101040570 A 9/2007
(Continued)

OTHER PUBLICATIONS

China Patent Office, Notice of Allowance dated Sep. 1, 2021, in Application No. 201911371960.8.
(Continued)

*Primary Examiner* — Henry Luong
(74) *Attorney, Agent, or Firm* — Faegre Drinker Biddle & Reath LLP

(57) ABSTRACT

System and method for controlling one or more light emitting diodes. For example, the system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator and output a control signal to the bleeder. The sensing voltage indicates a magnitude of the first current.

10 Claims, 10 Drawing Sheets

Related U.S. Application Data continuation of application No. 16/124,739, filed on Sep. 7, 2018, now Pat. No. 11,201,612.

(51) Int. Cl.
  *H05B 47/105* (2020.01)
  *H03K 5/24* (2006.01)
  *H05B 45/3575* (2020.01)
  *G01R 19/165* (2006.01)

(52) U.S. Cl.
  CPC ..... *H05B 45/395* (2020.01); *G01R 19/16538* (2013.01); *Y02B 20/30* (2013.01)

(56) References Cited

U.S. PATENT DOCUMENTS

| | | |
|---|---|---|
| 4,253,045 A | 2/1981 | Weber |
| 5,144,205 A | 9/1992 | Motto et al. |
| 5,249,298 A | 9/1993 | Bolan et al. |
| 5,504,398 A | 4/1996 | Rothenbuhler |
| 5,949,197 A | 9/1999 | Kastner |
| 6,196,208 B1 | 3/2001 | Masters |
| 6,218,788 B1 | 4/2001 | Chen et al. |
| 6,229,271 B1 | 5/2001 | Liu |
| 6,278,245 B1 | 8/2001 | Li et al. |
| 7,038,399 B2 | 5/2006 | Lys et al. |
| 7,649,327 B2 | 1/2010 | Peng |
| 7,759,881 B1 | 7/2010 | Melanson |
| 7,825,715 B1 | 11/2010 | Greenberg |
| 7,880,400 B2 | 2/2011 | Zhou et al. |
| 7,944,153 B2 | 5/2011 | Greenfeld |
| 8,018,171 B1 | 9/2011 | Melanson et al. |
| 8,098,021 B2 | 1/2012 | Wang et al. |
| 8,129,976 B2 | 3/2012 | Blakeley |
| 8,134,302 B2 | 3/2012 | Yang et al. |
| 8,278,832 B2 | 10/2012 | Hung et al. |
| 8,373,313 B2 | 2/2013 | Garcia et al. |
| 8,378,583 B2 | 2/2013 | Hying et al. |
| 8,378,588 B2 | 2/2013 | Kuo et al. |
| 8,378,589 B2 | 2/2013 | Kuo et al. |
| 8,415,901 B2 | 4/2013 | Recker et al. |
| 8,432,438 B2 | 4/2013 | Ryan et al. |
| 8,497,637 B2 | 7/2013 | Liu |
| 8,558,477 B2 | 10/2013 | Bordin et al. |
| 8,569,956 B2 | 10/2013 | Shteynberg et al. |
| 8,644,041 B2 | 2/2014 | Pansier |
| 8,653,750 B2 | 2/2014 | Deurenberg et al. |
| 8,686,668 B2 | 4/2014 | Grotkowski et al. |
| 8,698,419 B2 | 4/2014 | Yan et al. |
| 8,716,882 B2 | 5/2014 | Pettler et al. |
| 8,742,674 B2 | 6/2014 | Shteynberg et al. |
| 8,829,819 B1 | 9/2014 | Angeles et al. |
| 8,890,440 B2 | 11/2014 | Yan et al. |
| 8,896,288 B2 | 11/2014 | Choi et al. |
| 8,941,323 B1 | 1/2015 | Wu et al. |
| 8,941,324 B2 | 1/2015 | Zhou et al. |
| 8,941,328 B2 | 1/2015 | Wu et al. |
| 8,947,010 B2 | 2/2015 | Barrow et al. |
| 9,030,122 B2 | 5/2015 | Yan et al. |
| 9,084,316 B2 | 7/2015 | Melanson et al. |
| 9,131,581 B1 | 9/2015 | Hsia et al. |
| 9,148,050 B2 | 9/2015 | Chiang |
| 9,167,638 B2 | 10/2015 | Le |
| 9,173,258 B2 | 10/2015 | Ekbote |
| 9,207,265 B1 | 12/2015 | Grisamore et al. |
| 9,220,133 B2 | 12/2015 | Salvestrini et al. |
| 9,220,136 B2 | 12/2015 | Zhang et al. |
| 9,247,623 B2 | 1/2016 | Recker et al. |
| 9,247,625 B2 | 1/2016 | Recker et al. |
| 9,301,349 B2 | 3/2016 | Zhu et al. |
| 9,332,609 B1 | 5/2016 | Rhodes et al. |
| 9,402,293 B2 | 7/2016 | Vaughan et al. |
| 9,408,269 B2 | 8/2016 | Zhu et al. |
| 9,414,455 B2 | 8/2016 | Zhou et al. |
| 9,467,137 B2 | 10/2016 | Eum et al. |
| 9,480,118 B2 | 10/2016 | Liao et al. |
| 9,485,833 B2 | 11/2016 | Datta et al. |
| 9,554,432 B2 | 1/2017 | Zhu et al. |
| 9,572,224 B2 | 2/2017 | Gaknoki et al. |
| 9,585,222 B2 | 2/2017 | Zhu et al. |
| 9,655,188 B1 | 5/2017 | Lewis et al. |
| 9,661,702 B2 | 5/2017 | Mednik et al. |
| 9,723,676 B2 | 8/2017 | Ganick et al. |
| 9,750,107 B2 | 8/2017 | Zhu et al. |
| 9,781,786 B2 | 10/2017 | Ho et al. |
| 9,820,344 B1 | 11/2017 | Papanicolaou |
| 9,883,561 B1 | 1/2018 | Liang et al. |
| 9,883,562 B2 | 1/2018 | Zhu et al. |
| 9,961,734 B2 | 5/2018 | Zhu et al. |
| 10,054,271 B2 | 8/2018 | Xiong et al. |
| 10,153,684 B2 | 12/2018 | Liu et al. |
| 10,194,500 B2 | 1/2019 | Zhu et al. |
| 10,264,642 B2 | 4/2019 | Liang et al. |
| 10,292,217 B2 | 5/2019 | Zhu et al. |
| 10,299,328 B2 | 5/2019 | Fu et al. |
| 10,334,677 B2 | 6/2019 | Zhu et al. |
| 10,342,087 B2 | 7/2019 | Zhu et al. |
| 10,362,643 B2 | 7/2019 | Kim et al. |
| 10,375,785 B2 | 8/2019 | Li et al. |
| 10,383,187 B2 | 8/2019 | Liao et al. |
| 10,405,392 B1 | 9/2019 | Shi et al. |
| 10,447,171 B2 | 10/2019 | Newman et al. |
| 10,448,469 B2 | 10/2019 | Zhu et al. |
| 10,448,470 B2 | 10/2019 | Zhu et al. |
| 10,455,657 B2 | 10/2019 | Zhu et al. |
| 10,499,467 B2 | 12/2019 | Wang |
| 10,512,131 B2 | 12/2019 | Zhu et al. |
| 10,530,268 B2 | 1/2020 | Newman et al. |
| 10,568,185 B1 | 2/2020 | Ostrovsky et al. |
| 10,616,975 B2 | 4/2020 | Gotou et al. |
| 10,687,397 B2 | 6/2020 | Zhu et al. |
| 10,785,837 B2 | 9/2020 | Li et al. |
| 10,827,588 B2 | 11/2020 | Zhu et al. |
| 10,973,095 B2 | 4/2021 | Zhu et al. |
| 10,999,903 B2 | 5/2021 | Li et al. |
| 10,999,904 B2 | 5/2021 | Zhu et al. |
| 11,026,304 B2 | 6/2021 | Li et al. |
| 11,183,996 B2 | 11/2021 | Zhu et al. |
| 11,201,612 B2 | 12/2021 | Zhu et al. |
| 11,206,015 B2 | 12/2021 | Zhu et al. |
| 11,212,885 B2 | 12/2021 | Liao et al. |
| 11,224,105 B2 | 1/2022 | Yang et al. |
| 11,252,799 B2 | 2/2022 | Li et al. |
| 11,297,704 B2 | 4/2022 | Zhu et al. |
| 11,405,992 B2 | 8/2022 | Li et al. |
| 11,564,299 B2 | 1/2023 | Li et al. |
| 11,570,859 B2 | 1/2023 | Zhu et al. |
| 2006/0022648 A1 | 2/2006 | Ben-Yaakov et al. |
| 2007/0182338 A1 | 8/2007 | Shteynberg et al. |
| 2007/0182699 A1 | 8/2007 | Ha et al. |
| 2007/0267978 A1 | 11/2007 | Shteynberg et al. |
| 2008/0224629 A1 | 9/2008 | Melanson |
| 2008/0224633 A1 | 9/2008 | Melanson et al. |
| 2008/0278092 A1 | 11/2008 | Lys et al. |
| 2009/0021469 A1 | 1/2009 | Yeo et al. |
| 2009/0085494 A1 | 4/2009 | Summerland |
| 2009/0251059 A1 | 10/2009 | Veltman |
| 2010/0141153 A1 | 6/2010 | Recker et al. |
| 2010/0148691 A1 | 6/2010 | Kuo et al. |
| 2010/0156319 A1 | 6/2010 | Melanson |
| 2010/0164406 A1 | 7/2010 | Kost et al. |
| 2010/0176733 A1 | 7/2010 | King |
| 2010/0207536 A1 | 8/2010 | Burdalski et al. |
| 2010/0213859 A1 | 8/2010 | Shteynberg et al. |
| 2010/0219766 A1 | 9/2010 | Kuo et al. |
| 2010/0231136 A1 | 9/2010 | Reisenauer et al. |
| 2011/0012530 A1 | 1/2011 | Zheng et al. |
| 2011/0037399 A1 | 2/2011 | Hung et al. |
| 2011/0074302 A1 | 3/2011 | Draper et al. |
| 2011/0080110 A1 | 4/2011 | Nuhfer et al. |
| 2011/0080111 A1 | 4/2011 | Nuhfer et al. |
| 2011/0080112 A1 | 4/2011 | Shearer et al. |
| 2011/0101867 A1 | 5/2011 | Wang et al. |
| 2011/0121744 A1 | 5/2011 | Salvestrini et al. |

(56) References Cited

U.S. PATENT DOCUMENTS

| | | | |
|---|---|---|---|
| 2011/0121754 A1 | 5/2011 | Shteynberg et al. |
| 2011/0133662 A1 | 6/2011 | Yan et al. |
| 2011/0140620 A1 | 6/2011 | Lin et al. |
| 2011/0140621 A1 | 6/2011 | Yi et al. |
| 2011/0187283 A1 | 8/2011 | Wang et al. |
| 2011/0227490 A1 | 9/2011 | Huynh |
| 2011/0260619 A1 | 10/2011 | Sadwick et al. |
| 2011/0285301 A1 | 11/2011 | Kuang et al. |
| 2011/0291583 A1 | 12/2011 | Shen |
| 2011/0309759 A1 | 12/2011 | Shteynberg et al. |
| 2012/0001548 A1 | 1/2012 | Recker et al. |
| 2012/0032604 A1 | 2/2012 | Hontele |
| 2012/0056553 A1 | 3/2012 | Koolen et al. |
| 2012/0069616 A1 | 3/2012 | Kitamura et al. |
| 2012/0080944 A1 | 4/2012 | Recker et al. |
| 2012/0081009 A1 | 4/2012 | Shteynberg et al. |
| 2012/0081032 A1 | 4/2012 | Huang |
| 2012/0081035 A1 | 4/2012 | Mccune, Jr. |
| 2012/0146526 A1 | 6/2012 | Lam et al. |
| 2012/0181944 A1 | 7/2012 | Jacobs et al. |
| 2012/0181946 A1 | 7/2012 | Melanson |
| 2012/0187857 A1 | 7/2012 | Ulmann et al. |
| 2012/0242237 A1 | 9/2012 | Chen et al. |
| 2012/0262093 A1 | 10/2012 | Recker et al. |
| 2012/0268031 A1 | 10/2012 | Zhou et al. |
| 2012/0274227 A1 | 11/2012 | Zheng et al. |
| 2012/0286679 A1 | 11/2012 | Liu |
| 2012/0299500 A1 | 11/2012 | Sadwick et al. |
| 2012/0299501 A1 | 11/2012 | Kost et al. |
| 2012/0299511 A1 | 11/2012 | Montante et al. |
| 2012/0319604 A1 | 12/2012 | Walters |
| 2012/0326616 A1 | 12/2012 | Sumitani et al. |
| 2013/0009561 A1 | 1/2013 | Briggs |
| 2013/0020965 A1 | 1/2013 | Kang et al. |
| 2013/0026942 A1 | 1/2013 | Ryan et al. |
| 2013/0026945 A1 | 1/2013 | Ganick et al. |
| 2013/0027528 A1 | 1/2013 | Staats et al. |
| 2013/0034172 A1 | 2/2013 | Pettler et al. |
| 2013/0043726 A1 | 2/2013 | Krishnamoorthy et al. |
| 2013/0049631 A1 | 2/2013 | Riesebosch |
| 2013/0063047 A1 | 3/2013 | Veskovic |
| 2013/0134904 A1 | 5/2013 | Yau et al. |
| 2013/0141001 A1 | 6/2013 | Datta et al. |
| 2013/0154487 A1 | 6/2013 | Kuang et al. |
| 2013/0162155 A1 | 6/2013 | Matsuda et al. |
| 2013/0162158 A1 | 6/2013 | Pollischansky |
| 2013/0169177 A1 | 7/2013 | Liao et al. |
| 2013/0175931 A1 | 7/2013 | Sadwick |
| 2013/0181630 A1 | 7/2013 | Taipale et al. |
| 2013/0187568 A1 | 7/2013 | Jelaca et al. |
| 2013/0193866 A1 | 8/2013 | Datta et al. |
| 2013/0193879 A1 | 8/2013 | Sadwick et al. |
| 2013/0194848 A1 | 8/2013 | Bernardinis et al. |
| 2013/0215655 A1 | 8/2013 | Yang et al. |
| 2013/0223107 A1 | 8/2013 | Zhang et al. |
| 2013/0229121 A1 | 9/2013 | Otake et al. |
| 2013/0241427 A1 | 9/2013 | Kesterson et al. |
| 2013/0241428 A1 | 9/2013 | Takeda |
| 2013/0241441 A1 | 9/2013 | Myers et al. |
| 2013/0242622 A1 | 9/2013 | Peng et al. |
| 2013/0249431 A1 | 9/2013 | Shteynberg et al. |
| 2013/0278159 A1 | 10/2013 | Del et al. |
| 2013/0307430 A1 | 11/2013 | Blom |
| 2013/0307431 A1 | 11/2013 | Zhu et al. |
| 2013/0307434 A1 | 11/2013 | Zhang et al. |
| 2013/0342127 A1 | 12/2013 | Pan et al. |
| 2013/0343090 A1 | 12/2013 | Eom et al. |
| 2014/0009082 A1 | 1/2014 | King et al. |
| 2014/0029315 A1 | 1/2014 | Zhang et al. |
| 2014/0049177 A1 | 2/2014 | Kulczycki et al. |
| 2014/0063857 A1 | 3/2014 | Peng et al. |
| 2014/0078790 A1 | 3/2014 | Lin et al. |
| 2014/0103829 A1 | 4/2014 | Kang |
| 2014/0132172 A1 | 5/2014 | Zhu et al. |
| 2014/0160809 A1 | 6/2014 | Lin et al. |
| 2014/0176016 A1 | 6/2014 | Li et al. |
| 2014/0177280 A1 | 6/2014 | Yang et al. |
| 2014/0197760 A1 | 7/2014 | Radermacher |
| 2014/0265898 A1 | 9/2014 | Del et al. |
| 2014/0265907 A1 | 9/2014 | Su et al. |
| 2014/0265935 A1 | 9/2014 | Sadwick et al. |
| 2014/0268935 A1 | 9/2014 | Chiang |
| 2014/0300274 A1 | 10/2014 | Acatrinei |
| 2014/0320031 A1 | 10/2014 | Wu et al. |
| 2014/0333228 A1 | 11/2014 | Angeles et al. |
| 2014/0346973 A1 | 11/2014 | Zhu et al. |
| 2014/0354157 A1 | 12/2014 | Morales |
| 2014/0354165 A1 | 12/2014 | Malyna et al. |
| 2014/0354170 A1 | 12/2014 | Gredler et al. |
| 2015/0015159 A1 | 1/2015 | Wang et al. |
| 2015/0035450 A1 | 2/2015 | Werner |
| 2015/0048757 A1 | 2/2015 | Boonen et al. |
| 2015/0062981 A1 | 3/2015 | Fang et al. |
| 2015/0077009 A1 | 3/2015 | Kunimatsu |
| 2015/0091470 A1 | 4/2015 | Zhou et al. |
| 2015/0137704 A1 | 5/2015 | Angeles et al. |
| 2015/0173140 A1 | 6/2015 | Wu et al. |
| 2015/0312978 A1 | 10/2015 | Vaughan et al. |
| 2015/0312982 A1 | 10/2015 | Melanson |
| 2015/0312988 A1 | 10/2015 | Liao et al. |
| 2015/0318789 A1 | 11/2015 | Yang et al. |
| 2015/0333764 A1 | 11/2015 | Pastore et al. |
| 2015/0357910 A1 | 12/2015 | Murakami et al. |
| 2015/0359054 A1 | 12/2015 | Lin et al. |
| 2015/0366010 A1 | 12/2015 | Mao et al. |
| 2015/0382424 A1 | 12/2015 | Knapp et al. |
| 2016/0014861 A1 | 1/2016 | Zhu et al. |
| 2016/0014865 A1 | 1/2016 | Zhu et al. |
| 2016/0037604 A1 | 2/2016 | Zhu et al. |
| 2016/0113077 A1 | 4/2016 | Akiyama |
| 2016/0119998 A1 | 4/2016 | Linnartz et al. |
| 2016/0128142 A1 | 5/2016 | Arulandu et al. |
| 2016/0134187 A1 | 5/2016 | Pregitzer et al. |
| 2016/0277411 A1 | 9/2016 | Dani et al. |
| 2016/0286617 A1 | 9/2016 | Takahashi et al. |
| 2016/0323957 A1 | 11/2016 | Hu et al. |
| 2016/0338163 A1 | 11/2016 | Zhu et al. |
| 2017/0006684 A1 | 1/2017 | Tu et al. |
| 2017/0027029 A1 | 1/2017 | Hu et al. |
| 2017/0055323 A1 | 2/2017 | Lim et al. |
| 2017/0064787 A1 | 3/2017 | Liao et al. |
| 2017/0099712 A1 | 4/2017 | Hilgers et al. |
| 2017/0181235 A1 | 6/2017 | Zhu et al. |
| 2017/0196063 A1 | 7/2017 | Zhu et al. |
| 2017/0251532 A1 | 8/2017 | Wang et al. |
| 2017/0311409 A1 | 10/2017 | Zhu et al. |
| 2017/0354008 A1 | 12/2017 | Eum et al. |
| 2017/0359880 A1 | 12/2017 | Zhu et al. |
| 2018/0035507 A1 | 2/2018 | Kumada et al. |
| 2018/0103520 A1 | 4/2018 | Zhu et al. |
| 2018/0110104 A1 | 4/2018 | Liang et al. |
| 2018/0115234 A1 | 4/2018 | Liu et al. |
| 2018/0139816 A1* | 5/2018 | Liu .................. H05B 45/3575 |
| 2018/0263089 A1 | 9/2018 | Seyler et al. |
| 2018/0288845 A1 | 10/2018 | Zhu et al. |
| 2018/0310376 A1 | 10/2018 | Huang et al. |
| 2019/0069364 A1 | 2/2019 | Zhu et al. |
| 2019/0069366 A1 | 2/2019 | Liao et al. |
| 2019/0082507 A1 | 3/2019 | Zhu et al. |
| 2019/0104583 A1 | 4/2019 | Konishi et al. |
| 2019/0124736 A1 | 4/2019 | Zhu et al. |
| 2019/0166667 A1 | 5/2019 | Li et al. |
| 2019/0230755 A1 | 7/2019 | Zhu et al. |
| 2019/0327810 A1 | 10/2019 | Zhu et al. |
| 2019/0350055 A1 | 11/2019 | Wu et al. |
| 2019/0350060 A1 | 11/2019 | Li et al. |
| 2019/0364628 A1 | 11/2019 | Chen et al. |
| 2019/0380183 A1 | 12/2019 | Li et al. |
| 2020/0100340 A1 | 3/2020 | Zhu et al. |
| 2020/0146121 A1 | 5/2020 | Zhu et al. |
| 2020/0205263 A1 | 6/2020 | Zhu et al. |
| 2020/0205264 A1 | 6/2020 | Zhu et al. |
| 2020/0267817 A1 | 8/2020 | Yang et al. |
| 2020/0305247 A1 | 9/2020 | Li et al. |

(56) References Cited

U.S. PATENT DOCUMENTS

| | | | |
|---|---|---|---|
| 2020/0375001 | A1 | 11/2020 | Jung et al. |
| 2021/0007195 | A1 | 1/2021 | Zhu et al. |
| 2021/0007196 | A1 | 1/2021 | Zhu et al. |
| 2021/0045213 | A1 | 2/2021 | Zhu et al. |
| 2021/0153313 | A1 | 5/2021 | Li et al. |
| 2021/0195709 | A1 | 6/2021 | Li et al. |
| 2021/0204375 | A1 | 7/2021 | Li et al. |
| 2022/0149829 | A1 | 5/2022 | Zhu et al. |
| 2022/0209762 | A1 | 6/2022 | Zhu et al. |
| 2022/0210880 | A1 | 6/2022 | Li et al. |
| 2022/0217824 | A1 | 7/2022 | Zhu et al. |
| 2022/0225480 | A1 | 7/2022 | Li et al. |
| 2022/0225483 | A1 | 7/2022 | Yang et al. |

FOREIGN PATENT DOCUMENTS

| | | | |
|---|---|---|---|
| CN | 101657057 | A | 2/2010 |
| CN | 101868090 | A | 10/2010 |
| CN | 101896022 | A | 11/2010 |
| CN | 101917804 | A | 12/2010 |
| CN | 101938865 | A | 1/2011 |
| CN | 101998734 | A | 3/2011 |
| CN | 102014540 | A | 4/2011 |
| CN | 102014551 | A | 4/2011 |
| CN | 102056378 | A | 5/2011 |
| CN | 102209412 | A | 10/2011 |
| CN | 102300375 | A | 12/2011 |
| CN | 102347607 | A | 2/2012 |
| CN | 102387634 | A | 3/2012 |
| CN | 102474953 | A | 5/2012 |
| CN | 102497706 | A | 6/2012 |
| CN | 102612194 | A | 7/2012 |
| CN | 202353859 | U | 7/2012 |
| CN | 102668717 | A | 9/2012 |
| CN | 102695330 | A | 9/2012 |
| CN | 102791056 | A | 11/2012 |
| CN | 102843836 | A | 12/2012 |
| CN | 202632722 | U | 12/2012 |
| CN | 102870497 | A | 1/2013 |
| CN | 102946674 | A | 2/2013 |
| CN | 103004290 | A | 3/2013 |
| CN | 103024994 | A | 4/2013 |
| CN | 103096606 | A | 5/2013 |
| CN | 103108470 | A | 5/2013 |
| CN | 103260302 | A | 8/2013 |
| CN | 103313472 | A | 9/2013 |
| CN | 103369802 | A | 10/2013 |
| CN | 103379712 | A | 10/2013 |
| CN | 103428953 | A | 12/2013 |
| CN | 103458579 | A | 12/2013 |
| CN | 103547014 | A | 1/2014 |
| CN | 103648219 | A | 3/2014 |
| CN | 103716934 | A | 4/2014 |
| CN | 103781229 | A | 5/2014 |
| CN | 103858524 | A | 6/2014 |
| CN | 203675408 | U | 6/2014 |
| CN | 103945614 | A | 7/2014 |
| CN | 103957634 | A | 7/2014 |
| CN | 102612194 | B | 8/2014 |
| CN | 104066254 | A | 9/2014 |
| CN | 103096606 | B | 12/2014 |
| CN | 104619077 | A | 5/2015 |
| CN | 204392621 | U | 6/2015 |
| CN | 104768265 | A | 7/2015 |
| CN | 104902653 | A | 9/2015 |
| CN | 105072742 | A | 11/2015 |
| CN | 105246218 | A | 1/2016 |
| CN | 105265019 | A | 1/2016 |
| CN | 105423140 | A | 3/2016 |
| CN | 105591553 | A | 5/2016 |
| CN | 105873269 | A | 8/2016 |
| CN | 105992440 | A | 10/2016 |
| CN | 106105395 | A | 11/2016 |
| CN | 106163009 | A | 11/2016 |
| CN | 205812458 | U | 12/2016 |
| CN | 106332374 | A | 1/2017 |
| CN | 106332390 | A | 1/2017 |
| CN | 106358337 | A | 1/2017 |
| CN | 106413189 | A | 2/2017 |
| CN | 206042434 | U | 3/2017 |
| CN | 106604460 | A | 4/2017 |
| CN | 106793246 | A | 5/2017 |
| CN | 106888524 | A | 6/2017 |
| CN | 106912144 | A | 6/2017 |
| CN | 107046751 | A | 8/2017 |
| CN | 107069726 | A | 8/2017 |
| CN | 106888524 | B | 1/2018 |
| CN | 107645804 | A | 1/2018 |
| CN | 107995747 | A | 5/2018 |
| CN | 107995750 | A | 5/2018 |
| CN | 207460551 | U | 6/2018 |
| CN | 108337764 | A | 7/2018 |
| CN | 108366460 | A | 8/2018 |
| CN | 207744191 | U | 8/2018 |
| CN | 207910676 | U | 9/2018 |
| CN | 108834259 | A | 11/2018 |
| CN | 109246885 | A | 1/2019 |
| CN | 208572500 | U | 3/2019 |
| CN | 109729621 | A | 5/2019 |
| CN | 110086362 | A | 8/2019 |
| CN | 110099495 | A | 8/2019 |
| CN | 110493913 | A | 11/2019 |
| EP | 2403318 | A1 | 1/2012 |
| EP | 2590477 | A1 | 5/2013 |
| EP | 2938164 | A2 | 10/2015 |
| JP | 2008-010152 | A | 1/2008 |
| JP | 2011-249328 | A | 12/2011 |
| TW | 201125441 | A | 7/2011 |
| TW | 201132241 | A | 9/2011 |
| TW | 201143501 | A | 12/2011 |
| TW | 201143530 | A | 12/2011 |
| TW | 201146087 | A | 12/2011 |
| TW | 201204168 | A | 1/2012 |
| TW | 201208463 | A | 2/2012 |
| TW | 201208481 | A | 2/2012 |
| TW | 201208486 | A | 2/2012 |
| TW | 201215228 | A | 4/2012 |
| TW | 201233021 | A | 8/2012 |
| TW | 201244543 | A | 11/2012 |
| TW | I387396 | B | 2/2013 |
| TW | 201315118 | A | 4/2013 |
| TW | 201322825 | A | 6/2013 |
| TW | 201336345 | A | 9/2013 |
| TW | 201342987 | A | 10/2013 |
| TW | 201348909 | A | 12/2013 |
| TW | I422130 | B | 1/2014 |
| TW | I423732 | B | 1/2014 |
| TW | 201412189 | A | 3/2014 |
| TW | 201414146 | A | 4/2014 |
| TW | I434616 | B | 4/2014 |
| TW | M477115 | U | 4/2014 |
| TW | 201417626 | A | 5/2014 |
| TW | 201417631 | A | 5/2014 |
| TW | 201422045 | A | 6/2014 |
| TW | 201424454 | A | 6/2014 |
| TW | I441428 | B | 6/2014 |
| TW | I448198 | B | 8/2014 |
| TW | 201503756 | A | 1/2015 |
| TW | 201515514 | A | 4/2015 |
| TW | I496502 | B | 8/2015 |
| TW | 201603644 | A | 1/2016 |
| TW | 201607368 | A | 2/2016 |
| TW | I524814 | B | 3/2016 |
| TW | I535175 | B | 5/2016 |
| TW | I540809 | B | 7/2016 |
| TW | 201630468 | A | 8/2016 |
| TW | 201639415 | A | 11/2016 |
| TW | I630842 | B | 7/2018 |
| TW | 201909699 | A | 3/2019 |

(56) References Cited

FOREIGN PATENT DOCUMENTS

TW 201927074 A 7/2019
WO 2008/112820 A2 9/2008

OTHER PUBLICATIONS

China Patent Office, Office Action dated Apr. 15, 2021, in Application No. 201911371960.8.
China Patent Office, Office Action dated Apr. 30, 2021, in Application No. 201910719931.X.
China Patent Office, Office Action dated Aug. 28, 2015, in Application No. 201410322602.9.
China Patent Office, Office Action dated Aug. 8, 2015, in Application No. 201410172086.6.
China Patent Office, Office Action dated Dec. 14, 2015, in Application No. 201210166672.0.
China Patent Office, Office Action dated Dec. 3, 2018, in Application No. 201710557179.4.
China Patent Office, Office Action dated Feb. 1, 2021, in Application No. 201911140844.5.
China Patent Office, Office Action dated Feb. 3, 2021, in Application No. 201911316902.5.
China Patent Office, Office Action dated Jan. 17, 2022, in Application No. 201910124049.0.
China Patent Office, Office Action dated Jan. 9, 2020, in Application No. 201710828263.5.
China Patent Office, Office Action dated Jul. 7, 2014, in Application No. 201210468505.1.
China Patent Office, Office Action dated Jun. 3, 2014, in Application No. 201110103130.4.
China Patent Office, Office Action dated Jun. 30, 2015, in Application No. 201410171893.6.
China Patent Office, Office Action dated Mar. 2, 2016, in Application No. 201410172086.6.
China Patent Office, Office Action dated Mar. 22, 2016, in Application No. 201410322612.2.
China Patent Office, Office Action dated Mar. 22, 2019, in Application No. 201711464007.9.
China Patent Office, Office Action dated May 26, 2021, in Application No. 201910124049.0.
China Patent Office, Office Action dated Nov. 15, 2014, in Application No. 201210166672.0.
China Patent Office, Office Action dated Nov. 15, 2021, in Application No. 201911316902.5.
China Patent Office, Office Action dated Nov. 2, 2020, in Application No. 201910124049.0.
China Patent Office, Office Action dated Nov. 23, 2021, in Application No. 201911140844.5.
China Patent Office, Office Action dated Nov. 29, 2018, in Application No. 201710828263.5.
China Patent Office, Office Action dated Oct. 19, 2015, in Application No. 201410322612.2.
China Patent Office, Office Action dated Sep. 2, 2016, in Application No. 201510103579.9.
Qi et al., "Sine Wave Dimming Circuit Based on PIC16 MCU," Electronic Technology Application in 2014, vol. 10, (2014).
Taiwan Intellectual Property Office, Office Action dated Apr. 18, 2016, in Application No. 103140989.
Taiwan Intellectual Property Office, Office Action dated Apr. 27, 2020, in Application No. 108116002.
Taiwan Intellectual Property Office, Office Action dated Apr. 7, 2021, in Application No. 109111042.
Taiwan Intellectual Property Office, Office Action dated Aug. 23, 2017, in Application No. 106103535.
Taiwan Intellectual Property Office, Office Action dated Aug. 27, 2020, in Application No. 107107508.
Taiwan Intellectual Property Office, Office Action dated Dec. 27, 2019, in Application No. 108116002.
Taiwan Intellectual Property Office, Office Action dated Feb. 11, 2020, in Application No. 107107508.
Taiwan Intellectual Property Office, Office Action dated Feb. 27, 2018, in Application No. 106136242.
Taiwan Intellectual Property Office, Office Action dated Feb. 6, 2018, in Application No. 106130686.
Taiwan Intellectual Property Office, Office Action dated Jan. 14, 2019, in Application No. 107107508.
Taiwan Intellectual Property Office, Office Action dated Jan. 21, 2021, in Application No. 109108798.
Taiwan Intellectual Property Office, Office Action dated Jan. 4, 2021, in Application No. 109111042.
Taiwan Intellectual Property Office, Office Action dated Jan. 7, 2014, in Application No. 100119272.
Taiwan Intellectual Property Office, Office Action dated Jun. 16, 2020, in Application No. 108136083.
Taiwan Intellectual Property Office, Office Action dated Jun. 9, 2014, in Application No. 101124982.
Taiwan Intellectual Property Office, Office Action dated May 28, 2019, in Application No. 107112306.
Taiwan Intellectual Property Office, Office Action dated Nov. 13, 2015, in Application No. 103141628.
Taiwan Intellectual Property Office, Office Action dated Nov. 30, 2020, in Application No. 107107508.
Taiwan Intellectual Property Office, Office Action dated Oct. 31, 2019, in Application No. 107107508.
Taiwan Intellectual Property Office, Office Action dated Sep. 17, 2015, in Application No. 103127108.
Taiwan Intellectual Property Office, Office Action dated Sep. 17, 2015, in Application No. 103127620.
Taiwan Intellectual Property Office, Office Action dated Sep. 25, 2014, in Application No. 101148716.
Taiwan Intellectual Property Office, Office Action dated Sep. 9, 2020, in Application No. 108148566.
United States Patent and Trademark Office, Notice of Allowance dated Dec. 19, 2022, in U.S. Appl. No. 17/528,153.
United States Patent and Trademark Office, Notice of Allowance dated Jan. 28, 2022, in U.S. Appl. No. 17/096,741.
United States Patent and Trademark Office, Notice of Allowance dated Jul. 7, 2022, in U.S. Appl. No. 17/023,615.
United States Patent and Trademark Office, Notice of Allowance dated Jun. 24, 2022, in U.S. Appl. No. 17/096,741.
United States Patent and Trademark Office, Notice of Allowance dated Nov. 2, 2022, in U.S. Appl. No. 17/023,632.
United States Patent and Trademark Office, Notice of Allowance dated Oct. 3, 2022, in U.S. Appl. No. 17/023,615.
United States Patent and Trademark Office, Notice of Allowance dated Oct. 4, 2021, in U.S. Appl. No. 17/096,741.
United States Patent and Trademark Office, Notice of Allowance dated Oct. 4, 2022, in U.S. Appl. No. 17/554,306.
United States Patent and Trademark Office, Notice of Allowance dated Sep. 12, 2022, in U.S. Appl. No. 17/023,632.
United States Patent and Trademark Office, Notice of Allowance dated Sep. 29, 2022, in U.S. Appl. No. 17/096,741.
United States Patent and Trademark Office, Office Action dated Dec. 15, 2021, in U.S. Appl. No. 17/023,632.
United States Patent and Trademark Office, Office Action dated Oct. 5, 2021, in U.S. Appl. No. 17/023,615.
United States Patent and Trademark Office, Office Action dated Apr. 26, 2022, in U.S. Appl. No. 17/023,632.
United States Patent and Trademark Office, Office Action dated Jul. 15, 2022, in U.S. Appl. No. 17/528,153.
United States Patent and Trademark Office, Office Action dated Mar. 15, 2022, in U.S. Appl. No. 17/023,615.
United States Patent and Trademark Office, Office Action dated Oct. 19, 2022, in U.S. Appl. No. 17/520,573.
United States Patent and Trademark Office, Office Action dated Oct. 5, 2022, in U.S. Appl. No. 17/502,916.
United States Patent and Trademark Office, Office Action dated Sep. 14, 2022, in U.S. Appl. No. 17/545,752.
United States Patent and Trademark Office, Office Action dated Sep. 16, 2022, in U.S. Appl. No. 17/578,706.

(56) References Cited

OTHER PUBLICATIONS

United States Patent and Trademark Office, Notice of Allowance dated Apr. 12, 2023, in U.S. Appl. No. 17/545,752.
United States Patent and Trademark Office, Notice of Allowance dated Feb. 14, 2023, in U.S. Appl. No. 17/520,573.
United States Patent and Trademark Office, Notice of Allowance dated Feb. 8, 2023, in U.S. Appl. No. 17/554,306.
United States Patent and Trademark Office, Notice of Allowance dated Jan. 19, 2023, in U.S. Appl. No. 17/528,153.
United States Patent and Trademark Office, Office Action dated Jan. 26, 2023, in U.S. Appl. No. 17/578,706.
United States Patent and Trademark Office, Office Action dated Mar. 22, 2023, in U.S. Appl. No. 17/502,916.
United States Patent and Trademark Office, Notice of Allowance dated Jun. 6, 2023, in U.S. Appl. No. 17/578,706.
United States Patent and Trademark Office, Notice of Allowance dated Aug. 3, 2023, in U.S. Appl. No. 18/081,528.
United States Patent and Trademark Office, Office Action dated Jun. 12, 2023, in U.S. Appl. No. 18/103,971.

* cited by examiner

SWITCH CONTROL SYSTEMS FOR LIGHT EMITTING DIODES AND METHODS THEREOF

1. CROSS-REFERENCES TO RELATED APPLICATIONS

This application is a divisional of U.S. patent application Ser. No. 16/809,405, filed Mar. 4, 2020, which is a continuation of U.S. patent application Ser. No. 16/124,739, filed Sep. 7, 2018, which claims priority to Chinese Patent Application No. 201710557179.4, filed Jul. 10, 2017, all of the above-referenced applications being incorporated by reference herein for all purposes.

2. BACKGROUND OF THE INVENTION

Certain embodiments of the present invention are directed to circuits. More particularly, some embodiments of the invention provide switch control systems for light emitting diodes (LEDs). Merely by way of example, some embodiments of the invention have been applied to LED lighting systems. But it would be recognized that the invention has a much broader range of applicability.

As a new energy-saving and environmentally-friendly light source, light emitting diode (LED) is widely used in various fields due to its high luminance, low power consumption and long life span. For example, within a range close to a rated current, luminance of an LED often is directly proportional to the current flowing through the LED but is independent of the voltage across the LED; therefore LED is often supplied with power from a constant current source during operation.

FIG. 1 is an exemplary circuit diagram showing a conventional linear constant current LED lighting system 100 with a Triode for Alternating Current (TRIAC) dimmer. The system 100 is widely used in various fields such as LED lighting due to the system's simple and reliable structure and low cost. As shown in FIG. 1, the main control unit of the system 100 includes a constant current (CC) unit 110 and a bleeder unit 120. The constant current unit 110 is used for constant current control of the LED lighting system 100. The bleeder unit 120 is used to generate a current sufficient to maintain the TRIAC dimmer during normal operation and thus prevent the TRIAC dimmer from malfunctioning. A malfunction may occur if the current flowing through the TRIAC dimmer falls below a holding current.

As shown in FIG. 1, after the system 100 is powered on, an AC input voltage (e.g., VAC) is received by a TRIAC dimmer 190 and subjected to a full-wave rectification process to generate a rectified voltage 101 (e.g., VIN). For example, the rectified voltage 101 does not drop below 0 volt. In one example, there is a capacitor that includes one terminal connected to the output of the bleeder unit 120 and another terminal grounded. In another example, there is no capacitor that includes one terminal connected to the output of the bleeder unit 120 and another terminal grounded. After the system 100 is powered on, the amplifier U11 inside the constant current unit 110 controls the voltage of the gate terminal of the transistor M1, so that the transistor M1 for power regulation is closed (e.g., the transistor M1 being turned on).

After the system 100 is powered on, the error amplifier U11 of the main control unit controls the voltage of the gate terminal, so that the transistor M1 for power regulation is closed (e.g., the transistor M1 being turned on). As an example, the voltage 101 (e.g., VIN) is higher than a minimum forward operating voltage of the LED, and a current flows through the LED to a sensing resistor R1 via the transistor M1, wherein the magnitude of the voltage (e.g., $V_{sense}$) across the resistor R1 corresponds to the current flowing through the LED. The amplifier U11 receives the voltage $V_{sense}$ at one input terminal and receives a reference voltage $V_{ref}$ at another input terminal, and performs an error amplification process on the voltage $V_{sense}$ and the reference voltage $V_{ref}$ in order to adjust the gate voltage of the power regulation transistor M1 and realize constant current control for the LED. The output LED current $I_{led}$ (e.g., the current flowing through the LED) is shown in Equation 1:

$$I_{led} = \frac{V_{ref}}{R_1} \qquad \text{(Equation 1)}$$

where $R_1$ represents the resistance of the resistor R1, and $V_{ref}$ represents the reference voltage.

Due to the dimming function of the TRIAC dimmer 190, the rectified voltage 101 (e.g., VIN) received by the anode of the LED usually has a waveform of an AC signal that has been rectified and clipped. As an example, when the AC signal is relatively small in magnitude within an AC cycle (e.g., when the TRIAC dimmer 190 is turned off, or during the valley stage in magnitude for the AC signal), the LED does not conduct current because of the insufficient voltage and does not have a current flowing through.

As a result, taking into account these scenarios, the output LED current $I_{led}$ (e.g., the current flowing through the LED) is shown in Equation 2:

$$I_{led} = \frac{V_{ref}}{R_1} \times \frac{T_{on}}{T} \qquad \text{(Equation 2)}$$

where T represents one period of the AC input voltage (e.g., VAC), and $T_{on}$ represents time duration for conduction of the LED during one period of the AC input voltage (e.g., VAC).

Therefore, the bleeder unit 120 needs to generate an output current that is sufficient to maintain the normal operation of the TRIAC dimmer 190. From the perspective of system power, the input power of the system 100 includes mainly the LED power and the bleeder power:

$$P_{in} = P_{led} + P_{bleeder} \qquad \text{(Equation 3)}$$

where $P_{in}$ represents the input power of the system 100, $P_{led}$ represents the power consumed by the LED, and $P_{bleeder}$ represents the power consumed by the bleeder unit 120.

The resulting issue is that the power consumed by the bleeder unit 120 affects the operation efficiency of the system 100 as shown in Equation 4:

$$\eta = \frac{P_{led}}{P_{led} + P_{bleed}} \times 100\% \qquad \text{(Equation 4)}$$

where η represents the operation efficiency of the system 100. As indicated in Equation 4, if the power consumed by the bleeder unit 120 is too large, the operation efficiency of the system 100 often cannot be guaranteed.

Hence it is highly desirable to improve switch control systems for LEDs.

3. BRIEF SUMMARY OF THE INVENTION

In view of one or more problems described above, certain embodiments of the invention provide switch control systems for LEDs.

Some embodiments of the present invention provide a high-efficiency TRIAC dimmer switch control system for an LED lighting system and a method of using such switch control system. For example, the TRIAC dimmer switch control system reduces unnecessary power loss without affecting the normal operation of the LED lighting system in order to increase system efficiency by controlling the bleeder circuit. As an example, the control method may be applied to a linear constant current LED lighting system using a TRIAC dimmer.

In certain embodiments, an LED switch control system includes a constant current control unit, a bleeder unit, a bleeder control unit, and a rectifier unit. For example, the constant current control unit is coupled to a transistor and configured to output a first current. As an example, the bleeder unit is coupled to a system input and the bleeder control unit. For example, the bleeder control unit is coupled to the constant current control unit and the bleeder unit and configured to receive a sensing signal. As an example, the rectifier unit is configured to rectify and filter an input voltage of the system and transmit a rectified voltage to the bleeder unit and the constant current control unit. For example, the bleeder control unit is configured to generate a control signal to disable the bleeder unit when the sensing signal satisfies a first condition and to generate the control signal to enable the bleeder unit to output a bleeding current when the sensing signal does not satisfy the first condition. In some embodiments, an LED lighting system including an LED switch control system is provided.

According to certain embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator and output a control signal to the bleeder. The sensing voltage indicates a magnitude of the first current. The controller is further configured to generate the control signal to turn off the bleeder if the sensing voltage satisfies a first condition so that the bleeder does not generate a second current, and generate the control signal to turn on the bleeder if the sensing signal satisfies a second condition so that the bleeder generates the second current. The second current is larger than zero in magnitude. The second condition is different from the first condition.

According to some embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator, receive an input voltage generated by a voltage divider, and output a control signal to the bleeder. The sensing voltage indicates a magnitude of the first current, the voltage divider is configured to receive the rectified voltage, and the input voltage indicates a magnitude of the rectified voltage. The controller is further configured to generate the control signal to turn off the bleeder if the sensing voltage and the input voltage satisfy a first condition so that the bleeder does not generate a second current, and generate the control signal to turn on the bleeder if the sensing signal and the input voltage satisfy a second condition so that the bleeder generates the second current. The second current is larger than zero in magnitude. The second condition is different from the first condition.

According to some embodiments, a system for controlling one or more light emitting diodes includes a current generator configured to generate a first current flowing through one or more light emitting diodes. The one or more light emitting diodes is configured to receive a rectified voltage generated by a rectifying bridge coupled to a TRIAC dimmer. Additionally, the system includes a bleeder configured to receive the rectified voltage, and a controller configured to receive a sensing voltage from the current generator, the sensing voltage indicating a magnitude of the first current, receive an input voltage generated by a voltage divider, the voltage divider being configured to receive the rectified voltage, the input voltage indicating a magnitude of the rectified voltage, and output a control signal to the bleeder. The controller is further configured to generate the control signal to turn off the bleeder if the input voltage satisfies a first condition so that the bleeder does not generate a second current, and generate the control signal to turn on the bleeder if the input voltage satisfies a second condition so that the bleeder generates the second current. The second current is larger than zero in magnitude. The second condition is different from the first condition.

According to certain embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator, receive an input voltage generated by a voltage divider, and output a control signal to the bleeder. The sensing voltage indicates a magnitude of the first current, the voltage divider is configured to receive a dimmer output voltage generated by the TRIAC dimmer and received by the rectifying bridge, and the input voltage indicating a magnitude of the dimmer output voltage. The controller is further configured to generate the control signal to turn off the bleeder if the sensing voltage and the input voltage satisfy a first condition so that the bleeder does not generate a second current, and generate the control signal to turn on the bleeder if the sensing signal and the input voltage satisfy a second condition so that the bleeder generates the second current. The second current is larger than zero in magnitude. The second condition is different from the first condition.

According to some embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator, receive an input voltage generated by a voltage divider, and output a control signal to the bleeder. The sensing voltage indicates a magnitude of the first current, the voltage divider is configured to receive a dimmer output voltage generated by the TRIAC dimmer and received by the rectifying bridge, and the input voltage indicates a magnitude of the dimmer output voltage. The controller is further configured to generate the control signal to turn off the bleeder if the input voltage satisfies a first condition so that the bleeder does not generate a second current, and generate the control signal to turn on the bleeder if the input voltage satisfies a second condition so that the bleeder generates the second current. The second current is larger than zero in magnitude. The second condition is different from the first condition.

According to certain embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving the rectified voltage, receiving a sensing voltage, the sensing voltage indicating a magnitude of the first current, and outputting a control signal to a bleeder. The outputting a control signal to a bleeder includes generating the control signal to turn off the bleeder if the sensing voltage satisfies a first condition so that the bleeder does not generate a second current, and generating the control signal to turn on the bleeder if the sensing signal satisfies a second condition so that the bleeder generates the second current. The second current is larger than zero in magnitude. The second condition is different from the first condition.

According to some embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage, the sensing voltage indicating a magnitude of the first current, receiving an input voltage, the input voltage indicating a magnitude of the rectified voltage, and outputting a control signal to the bleeder. The outputting a control signal to the bleeder includes generating the control signal to turn off the bleeder if the sensing voltage and the input voltage satisfy a first condition so that the bleeder does not generate a second current, and generating the control signal to turn on the bleeder if the sensing signal and the input voltage satisfy a second condition so that the bleeder generates the second current. The second current is larger than zero in magnitude. The second condition is different from the first condition.

According to certain embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage, the sensing voltage indicating a magnitude of the first current, receiving an input voltage, the input voltage indicating a magnitude of the rectified voltage, and outputting a control signal to the bleeder. The outputting a control signal to the bleeder includes generating the control signal to turn off the bleeder if the input voltage satisfies a first condition so that the bleeder does not generate a second current, and generating the control signal to turn on the bleeder if the input voltage satisfies a second condition so that the bleeder generates the second current. The second current is larger than zero in magnitude. The second condition is different from the first condition.

According to some embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage, the sensing voltage indicating a magnitude of the first current, receiving an input voltage, the input voltage indicating a magnitude of a dimmer output voltage generated by the TRIAC dimmer and received by the rectifying bridge, and outputting a control signal to the bleeder. The outputting a control signal to the bleeder includes generating the control signal to turn off the bleeder if the sensing voltage and the input voltage satisfy a first condition so that the bleeder does not generate a second current, and generating the control signal to turn on the bleeder if the sensing signal and the input voltage satisfy a second condition so that the bleeder generates the second current. The second current is larger than zero in magnitude. The second condition is different from the first condition.

According to certain embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage; receiving an input voltage, and outputting a control signal to the bleeder. The sensing voltage indicates a magnitude of the first current, and the input voltage indicates a magnitude of a dimmer output voltage generated by the TRIAC dimmer and received by the rectifying bridge. The outputting a control signal to the bleeder includes generating the control signal to turn off the bleeder if the input voltage satisfies a first condition so that the bleeder does not generate a second current, and generating the control signal to turn on the bleeder if the input voltage satisfies a second condition so that the bleeder generates the second current. The second current is larger than zero in magnitude. The second condition is different from the first condition.

4. BRIEF DESCRIPTION OF THE DRAWINGS

According to various examples, other features, purposes, and advantages of the present invention will become apparent upon reading the detailed description of the following exemplary drawings, which describe features of one or more non-limiting embodiments. For example, the same or similar reference numerals indicate the same or similar features.

5. DETAILED DESCRIPTION OF THE INVENTION

Certain embodiments of the present invention are directed to circuits. More particularly, some embodiments of the invention provide switch control systems for light emitting diodes (LEDs). Merely by way of example, some embodiments of the invention have been applied to LED lighting systems. But it would be recognized that the invention has a much broader range of applicability.

Figure 1:
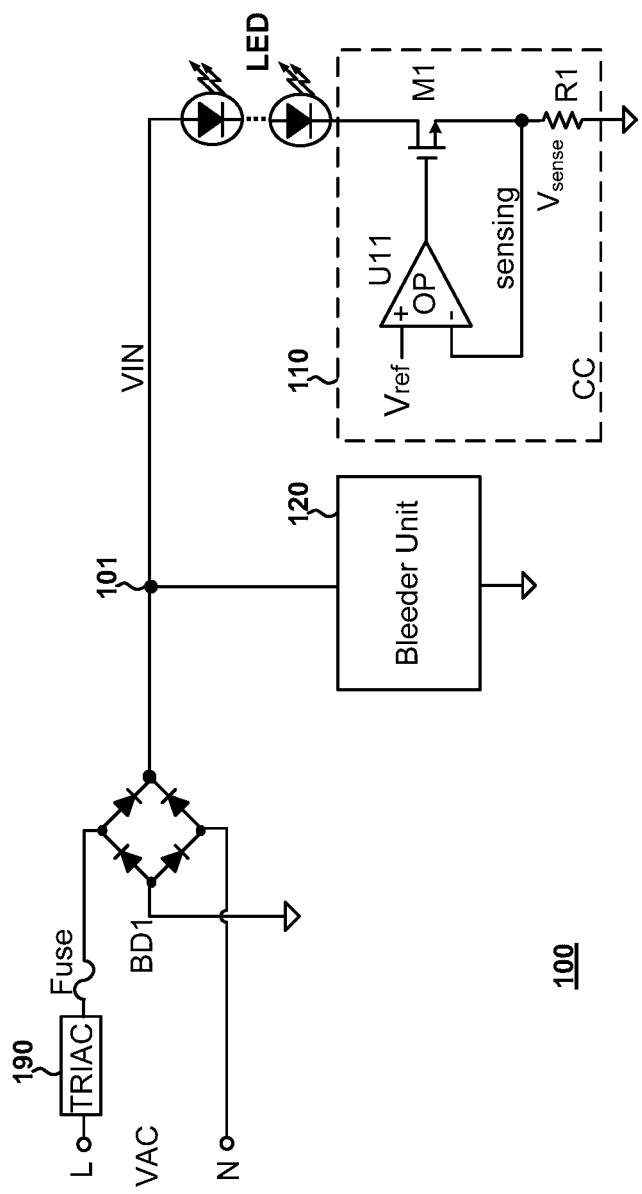
FIG. 1 is an exemplary circuit diagram showing a conventional linear constant current LED lighting system 100 with a TRIAC dimmer.
Figure 2:
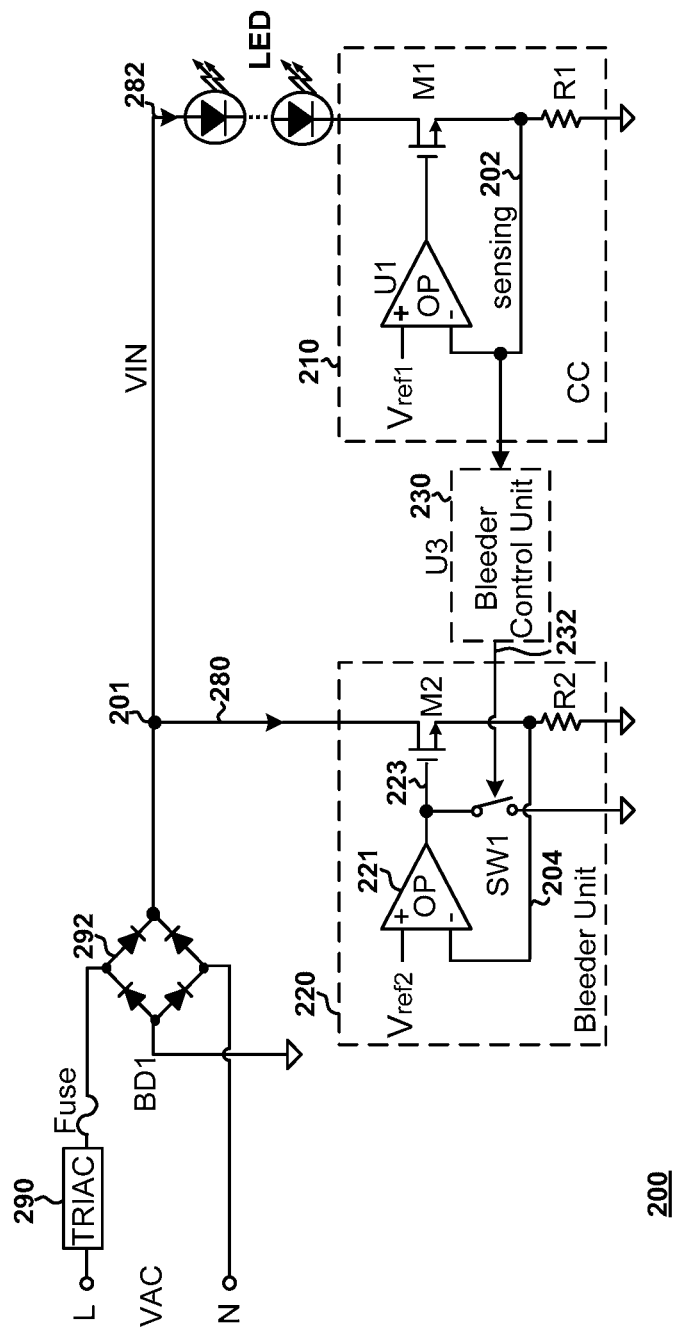
FIG. 2 is a simplified circuit diagram showing an LED lighting system with a TRIAC dimmer according to some embodiments of the present invention.

FIG. 2 is a simplified circuit diagram showing an LED lighting system with a TRIAC dimmer according to some embodiments of the present invention. This diagram is merely an example, which should not unduly limit the scope of the claims. One of ordinary skill in the art would recognize many variations, alternatives, and modifications. As shown in FIG. 2, the controller of the system 200 includes a constant current (CC) unit 210 (e.g., a current generator), a bleeder unit 220 (e.g., a bleeder), and a bleeder control unit 230 (e.g., a controller). In some examples, the system 200 includes a line (L) terminal and a neutral (N) terminal. For example, an AC input voltage (e.g., VAC) is received by a TRIAC dimmer 290 and also rectified (e.g., by a full wave rectifying bridge 292) to generate a rectified voltage 201 (e.g., VIN). As an example, the full wave rectifying bridge 292 is coupled to the TRIAC dimmer 290 through a fuse. For example, the rectified voltage 201 does not fall below the ground voltage of the chip (e.g., zero volt). In certain examples, the constant current unit 210 includes a transistor M1 for power regulation, a sensing resistor R1, and an amplifier U1 (e.g., an error amplifier). As an example, the source of the transistor M1 for power regulation is connected to the sensing resistor R1, the gate of the transistor M1 for power regulation is connected to an output terminal of the amplifier U1, and the drain of the transistor M1 for power regulation is connected to a cathode of an LED. Although the above has been shown using a selected group of components for the LED lighting system, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 2, the bleeder unit 220 includes an amplifier 221 (e.g., an error amplifier), a transistor M2 for power regulation, a resistor R2, and a switch SW1 according to certain embodiments. In some embodiments, one terminal of the resistor R2 is grounded, and another terminal of the resistor R2 is connected to the amplifier 221 to provide a sensing voltage 204 as an input. In certain embodiments, the amplifier 221 generates a signal 223 based on the sensing voltage 204 across the resistor R2 and a reference voltage $V_{ref2}$, and outputs the signal 223 to control the transistor M2 for power regulation if the switch SW1 is open.

For example, if the switch SW1 is closed, the bleeder unit 220 is turned off and/or stops working (e.g., the bleeder current 280 being equal to zero in magnitude). As an example, if the switch SW1 is open, the bleeder unit 220 is turned on, generating the bleeder current (e.g., $I_{bleed}$) as determined by Equation 5:

$$I_{bleed} = V_{ref2}/R_2 \qquad \text{(Equation 5)}$$

where $V_{ref2}$ represents the reference voltage received by the amplifier 221, and $R_2$ represents the resistance of the resistor R2.

According to some embodiments, the bleeder control unit 230 is configured to detect a change in a current 282 by receiving a sensing voltage $V_{sense}$ (e.g., a sensing voltage 202), and the current 282 is generated by the constant current unit 210. For example, the current 282 (e.g., $I_{led}$) flows through the LED into the constant current unit 210. As an example, the current 282 (e.g., $I_{led}$) flows through the resistor R1 to generate the sensing voltage $V_{sense}$ (e.g., the sensing voltage 202). In some examples, if the current 282 generated by the constant current unit 210 satisfies a first condition (e.g., when the current 282 is greater than a first threshold current), the bleeder control unit 230 (e.g., with or without a delay) turns off the bleeder unit 220 so that the bleeder unit 220 stops generating the bleeder current 280 (e.g., the bleeder current 280 being equal to zero in magnitude). For example, the bleeder control unit 230 is configured to turn off the bleeder unit 220 by enabling (e.g., by closing) the switch SW1. In certain examples, if the current 282 generated by the constant current unit 210 does not satisfy the first condition, the bleeder control unit 230 (e.g., with or without a delay) turns on the bleeder unit 220 so that the bleeder unit 220 generates the bleeder current 280 (e.g., the bleeder current 280 being larger than zero in magnitude), enabling a TRIAC dimmer 290 to operate normally. For example, the bleeder control unit 230 is configured to turn on the bleeder unit 220 by disabling (e.g., by opening) the switch SW1.

According to certain embodiments, the bleeder control unit 230 is configured to generate a control signal 232 to turn off the bleeder unit 220 (e.g., with or without a delay) if the sensing voltage 202 satisfies the first condition (e.g., when the sensing voltage 202 is greater than a first threshold voltage). According to some embodiments, the bleeder control unit 230 is configured to generate the control signal 232 to turn on the bleeder unit 220 to generate the bleeder current 280 (e.g., with or without a delay) if the sensing voltage 202 does not satisfy the first condition. For example, the bleeder control unit 230 includes a comparator that is configured to receive the sensing voltage 202 and the first threshold voltage in order to generate the control signal 232 based on at least the sensing voltage 202 and the first threshold voltage.

In some embodiments, the constant current (CC) unit 210 samples the peak amplitude of the sensing voltage 202 during each AC cycle, and transmits the sampled peak amplitude to the amplifier U1 of the constant current unit 210. As an example, the amplifier U1 of the constant current unit 210 also receives a reference voltage $V_{ref1}$ and processes the sensing voltage 202 on a cycle-by-cycle basis.

In certain embodiments, as shown in FIG. 2, the transistor M1 for power regulation is a field effect transistor (e.g., a metal-oxide-semiconductor field effect transistor (MOSFET)). For example, the transistor M1 for power regulation is an insulated gate bipolar transistor (IGBT). As an example, the transistor M1 for power regulation is a bipolar junction transistor. In some examples, the controller of the system 200 includes more or less components. In certain examples, the value of a reference voltage (e.g., the reference voltage $V_{ref1}$ and/or the reference voltage $V_{ref2}$) can be set as desired by those skilled in the art.

As discussed above and further emphasized here, FIG. 2 is merely an example, which should not unduly limit the scope of the claims. For example, the system 200 is configured to provide dimming control to one or more LEDs. As an example, multiple LEDs are connected in series.

Figure 3:
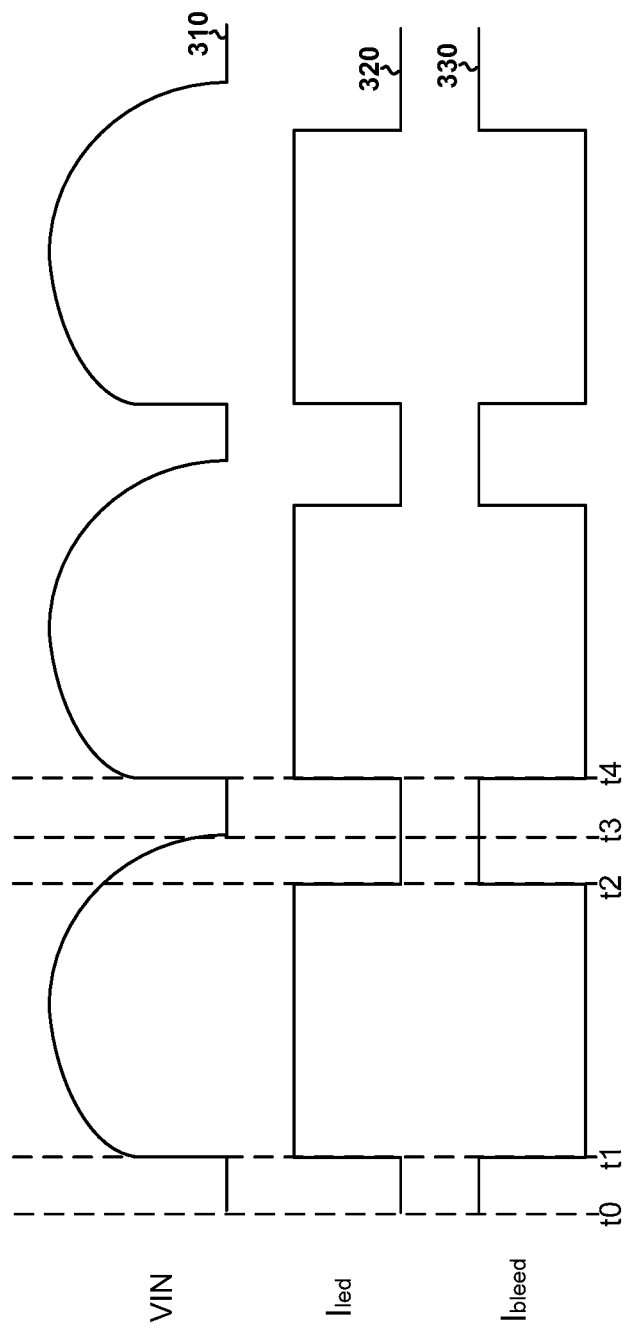
FIG. 3 shows simplified timing diagrams for controlling the LED lighting system as shown in FIG. 2 according to one embodiment of the present invention.

FIG. 3 shows simplified timing diagrams for controlling the LED lighting system 200 as shown in FIG. 2 according to one embodiment of the present invention. These diagrams are merely examples, which should not unduly limit the scope of the claims. One of ordinary skill in the art would recognize many variations, alternatives, and modifications. The waveform 310 represents the rectified voltage VIN (e.g., the rectified voltage 201) as a function of time, the waveform 320 represents the LED current $I_{led}$ (e.g., the current 282) as a function of time, and the waveform 330 represents the bleeder current $I_{bleed}$ (e.g., the bleeder current 280) as a function of time. According to some embodiments, the time period from time t0 to time t3 represents a half cycle of the AC input voltage (e.g., VAC). For example, the time period from time t0 to time t3 is equal to half a period of the AC input voltage (e.g., VAC). According to certain embodiments, the time period from time t1 to time t4 represents a half cycle of the AC input voltage (e.g., VAC). As an example, the time period from time t1 to time t4 is equal to half a period of the AC input voltage (e.g., VAC).

In some embodiments, from time t0 to time t1 (e.g., when the system 200 operates normally and the AC input voltage is clipped by the TRIAC dimmer 290), the rectified voltage 201 (e.g., VIN) is small in magnitude (e.g., close to 0V), and the constant current unit 210 is not able to generate the current 282 (e.g., the current 282 being equal to zero in magnitude). For example, from time t0 to time t1, the current 282 is equal to zero in magnitude due to the clipping effect of the TRIAC dimmer 290 as shown by the waveforms 310 and 320. As an example, from time t0 to time t1, the bleeder unit 220 is turned-on, generating the bleeder current 280 (e.g., the bleeder current 280 being larger than zero in magnitude), as shown by the waveform 330. In certain embodiments, from time t1 to time t3, the system 200 operates normally and the AC input voltage (e.g., VAC) is not clipped by the TRIAC dimmer 290. In some examples, from time t1 to time t2, the rectified voltage 201 (e.g., VIN) is sufficiently large in magnitude, and the constant current unit 210 is able to generate the current 282 (e.g., the current 282 being larger than zero in magnitude) as shown by the waveforms 310 and 320. For example, from time t1 to time t2, the current 282 is equal to a predetermined magnitude larger than zero as shown by the waveform 320. As an example, from time t1 to time t2, the bleeder unit 220 is turned off, not generating the bleeder current 280 (e.g., the bleeder current 280 being equal to zero in magnitude), as shown by the waveform 330. In certain examples, from time t2 to time t3, the rectified voltage 201 (e.g., VIN) is not sufficiently large in magnitude, and the constant current unit 210 is not able to generate the current 282 (e.g., the current 282 being equal to zero in magnitude) as shown by the waveforms 310 and 320. As an example, from time t2 to time t3, the bleeder unit 220 is turned-on, generating the bleeder current 280 (e.g., the bleeder current 280 being larger than zero in magnitude), as shown by the waveform 330. In some embodiments, from time t3 to time t4, the system 200 operates normally and the AC input voltage (e.g., VAC) is clipped by the TRIAC dimmer 290 as shown by the waveform 310. For example, from time t3 to time t4, the constant current unit 210 is unable to generate the current 282 (e.g., the current 282 being equal to zero in magnitude) as shown by the waveform 320. As an example, from time t3 to time t4, the bleeder unit 220 is turned-on, generating the bleeder current 280 (e.g., the bleeder current 280 being larger than zero in magnitude), as shown by the waveform 330.

In certain embodiments, the transistor M2 for power regulation is closed (e.g., being turned on) at a first time (e.g., time t0). For example, when the sensing voltage 202 is less than a first threshold voltage (e.g., $V_{ref3}$) (e.g., from time t0 to time t1), the control signal 232 is at a first logic level (e.g., at a logic low level). As an example, when the sensing voltage 202 is greater than the first threshold voltage (e.g., $V_{ref3}$) (e.g., from time t1 to time t2), the control signal 232 is at a second logic level (e.g., at a logic high level). For example, when the sensing voltage 202 is less than the first threshold voltage (e.g., $V_{ref3}$) (e.g., from time t2 to time t3), the control signal 232 is at the first logic level (e.g., at the logic low level).

As shown in FIG. 2, in some embodiments, if the switch SW1 is closed, the transistor M2 is turned off and the bleeder unit 220 is also turned off so that the bleeder current 280 is equal to zero in magnitude. In certain embodiments, if the switch SW1 is open, the transistor M2 can be turned on by the signal 223 and the bleeder unit 220 is also turned on so that the bleeder current 280 is larger than zero in magnitude.

Figure 4:
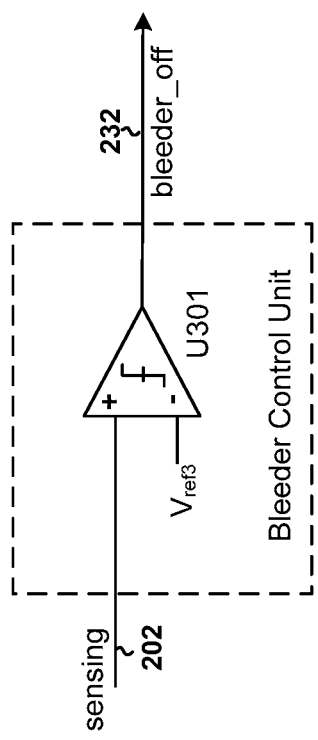
FIG. 4 is a simplified circuit diagram showing a bleeder control unit of an LED lighting system with a TRIAC dimmer (e.g., the bleeder control unit of the LED lighting system as shown in FIGS. 2 and 3) according to one embodiment of the present invention.

FIG. 4 is a simplified circuit diagram showing a bleeder control unit of an LED lighting system with a TRIAC dimmer (e.g., the bleeder control unit 230 of the LED lighting system 200 as shown in FIGS. 2 and 3) according to one embodiment of the present invention. This diagram is merely an example, which should not unduly limit the scope of the claims. One of ordinary skill in the art would recognize many variations, alternatives, and modifications. As shown in FIG. 4, the bleeder control unit (e.g., the bleeder control unit 230) includes a comparator U301. In some examples, the comparator U301 receives a reference voltage $V_{ref3}$ and a sensing voltage $V_{sense}$ (e.g., the sensing voltage 202), and outputs a bleeder control signal bleeder_off (e.g., the control signal 232). For example, if the bleeder control signal bleeder_off (e.g., the control signal 232) is at a logic high level, the switch SW1 is closed and the bleeder unit 220 is turned off so that the bleeder unit 220 does not generate the bleeder current 280 (e.g., the bleeder current 280 being equal to zero in magnitude). As an example, if the bleeder control signal bleeder_off (e.g., the control signal 232) is at a logic low level, the switch SW1 is open and the bleeder unit 220 is turned on so that the bleeder unit 220 generates the bleeder current 280 (e.g., the bleeder current 280 being larger than zero in magnitude). In certain examples, the system 200 determines the magnitude of the current 282 by sensing the voltage $V_{sense}$ across the sensing resistor R1 of the constant current unit 210 as shown in FIG. 2. Although the above has been shown using a selected group of components for the bleeder control unit, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the comparator U301 compares the reference voltage $V_{ref3}$ and the sensing voltage $V_{sense}$ (e.g., the sensing voltage 202). For example, if the current 282 generated by the constant current unit 210 is greater than the holding current of the TRIAC dimmer 290, when the sensing voltage $V_{sense}$ becomes larger than the reference voltage $V_{ref3}$ in magnitude, the comparator U301 generates the bleeder control signal bleeder_off (e.g., the control signal 232) at the logic high level to turn off the bleeder unit 220 so that the bleeder current 280 is equal to zero in magnitude. As an example, if the current 282 generated by the constant current unit 210 is less than the holding current of the TRIAC dimmer 290, when the sensing voltage $V_{sense}$ is smaller than the reference voltage $V_{ref3}$ in magnitude, the comparator U301 generates the bleeder control signal bleeder_off (e.g., the control signal 232) at the logic low level to turn on the bleeder unit 220 so that the bleeder current 280 is larger than zero in magnitude. In certain examples, the LED lighting system 200 that includes the bleeder control unit 230 as shown in FIG. 4 operates according to FIG. 3. In some examples, the reference voltage $V_{ref3}$ is smaller than the reference voltage $V_{ref1}$ of the constant current unit 210.

As discussed above and further emphasized here, FIG. 3 shows merely examples, which should not unduly limit the scope of the claims. In some examples, the TRIAC dimmer 290 needs the current that flows through the TRIAC dimmer 290 to not fall below a holding current during the time duration when the constant current unit 210 is supposed to generate the current 282 (e.g., the current 282 being larger than zero in magnitude) under normal operation. For example, if the current that flows through the TRIAC dimmer 290 falls below the holding current, the TRIAC dimmer 290 may misfire, causing the constant current unit 210 to operate abnormally. In certain examples, when the constant current unit 210 is not supposed to generate the current 282 (e.g., the current 282 being larger than zero in magnitude) under normal operation, if the current that flows through the TRIAC dimmer 290 falls below the holding current, luminance of the one or more LEDs of the system 200 would not be affected.

Figure 5:
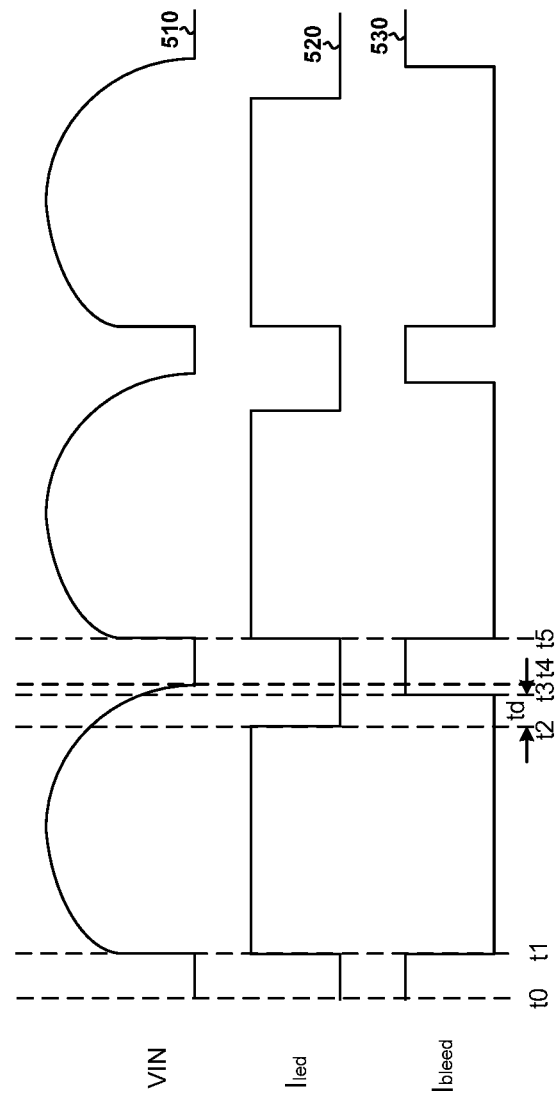
FIG. 5 shows simplified timing diagrams for controlling the LED lighting system as shown in FIG. 2 according to another embodiment of the present invention.

FIG. 5 shows simplified timing diagrams for controlling the LED lighting system 200 as shown in FIG. 2 according to another embodiment of the present invention. These diagrams are merely examples, which should not unduly limit the scope of the claims. One of ordinary skill in the art would recognize many variations, alternatives, and modifications. The waveform 510 represents the rectified voltage VIN (e.g., the rectified voltage 201) as a function of time, the waveform 520 represents the LED current $I_{led}$ (e.g., the current 282) as a function of time, and the waveform 530 represents the bleeder current $I_{bleed}$ (e.g., the bleeder current 280) as a function of time. According to some embodiments, the time period from time t0 to time t4 represents a half cycle of the AC input voltage (e.g., VAC). For example, the time period from time t0 to time t4 is equal to half a period of the AC input voltage (e.g., VAC). According to certain embodiments, the time period from time t1 to time t5 represents a half cycle of the AC input voltage (e.g., VAC). As an example, the time period from time t1 to time t5 is equal to half a period of the AC input voltage (e.g., VAC).

In some embodiments, from time t0 to time t1 (e.g., when the system 200 operates normally and the AC input voltage is clipped by the TRIAC dimmer 290), the rectified voltage 201 (e.g., VIN) is small in magnitude (e.g., close to 0V), and the constant current unit 210 is not able to generate the current 282 (e.g., the current 282 being equal to zero in magnitude). For example, from time t0 to time t1, the current 282 is equal to zero in magnitude due to the clipping effect of the TRIAC dimmer 290 as shown by the waveforms 510 and 520. As an example, from time t0 to time t1, the bleeder unit 220 is turned-on, generating the bleeder current 280 (e.g., the bleeder current 280 being larger than zero in magnitude), as shown by the waveform 530. In certain embodiments, from time t1 to time t4, the system 200 operates normally and the AC input voltage (e.g., VAC) is not clipped by the TRIAC dimmer 290. In some examples, from time t1 to time t2, the rectified voltage 201 (e.g., VIN) is sufficiently large in magnitude, and the constant current unit 210 is able to generate the current 282 (e.g., the current 282 being larger than zero in magnitude) as shown by the waveforms 510 and 520. For example, from time t1 to time t2, the current 282 is equal to a predetermined magnitude larger than zero as shown by the waveform 520. As an example, from time t1 to time t2, the bleeder unit 220 is turned off, not generating the bleeder current 280 (e.g., the bleeder current 280 being equal to zero in magnitude), as shown by the waveform 530. In certain examples, from time t2 to time t3, the rectified voltage 201 (e.g., VIN) is not sufficiently large in magnitude, and the constant current unit 210 is not able to generate the current 282 (e.g., the current 282 being equal to zero in magnitude) as shown by the waveforms 510 and 520. As an example, from time t2 to time t3, the bleeder unit 220 remains turned off, not generating the bleeder current 280 (e.g., the bleeder current 280 being equal to zero in magnitude), as shown by the waveform 530. For example, the time duration from time t2 to time t3 is represented by a constant delay td (e.g., a predetermined delay time duration). As an example, from time t2 to time t3, the bleeder current 280 remains equal to zero in magnitude to reduce the power consumption of the bleeder current 280.

In some examples, from time t3 to time t4, the rectified voltage 201 (e.g., VIN) remains not sufficiently large in magnitude, and the constant current unit 210 remains not able to generate the current 282 (e.g., the current 282 being equal to zero in magnitude) as shown by the waveforms 510 and 520. As an example, from time t3 to time t4, the bleeder unit 220 is turned-on, generating the bleeder current 280 (e.g., the bleeder current 280 being larger than zero in magnitude), as shown by the waveform 530. For example, the rectified voltage 201 (e.g., VIN) from time t3 to time t4 is smaller than the rectified voltage 201 (e.g., VIN) from time t2 to time t3, so the power consumption by the non-zero bleeder current 280 from time t3 to time t4 is also smaller than the power consumption of the bleeder current 280 from time t2 to time t3 if the same non-zero bleeder current 280 were generated from time t2 to time t3. In some embodiments, from time t4 to time t5, the system 200 operates normally and the AC input voltage (e.g., VAC) is clipped by the TRIAC dimmer 290 as shown by the waveform 510. For example, from time t4 to time t5, the constant current unit 210 is unable to generate the current 282 (e.g., the current 282 being equal to zero in magnitude), as shown by the waveform 520. As an example, from time t4 to time t5, the bleeder unit 220 is turned-on, generating the bleeder current 280 (e.g., the bleeder current 280 being larger than zero in magnitude), as shown by the waveform 530.

Figure 6:
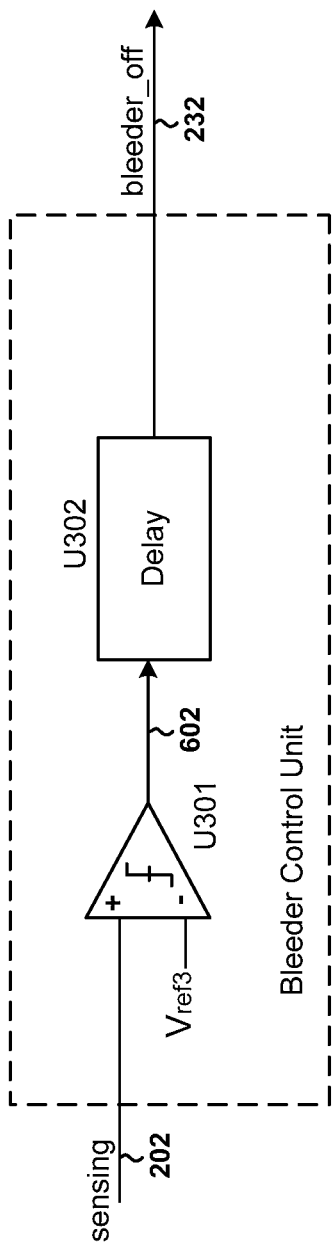
FIG. 6 is a simplified circuit diagram showing a bleeder control unit of an LED lighting system with a TRIAC dimmer (e.g., the bleeder control unit of the LED lighting system as shown in FIGS. 2 and 5) according to another embodiment of the present invention.

FIG. 6 is a simplified circuit diagram showing a bleeder control unit of an LED lighting system with a TRIAC dimmer (e.g., the bleeder control unit 230 of the LED lighting system 200 as shown in FIGS. 2 and 5) according to another embodiment of the present invention. This diagram is merely an example, which should not unduly limit the scope of the claims. One of ordinary skill in the art would recognize many variations, alternatives, and modifications. As shown in FIG. 6, the bleeder control unit (e.g., the bleeder control unit 230) includes a comparator U301 and a delay circuit U302. In some examples, the comparator U301 receives a reference voltage $V_{ref3}$ and a sensing voltage $V_{sense}$ (e.g., the sensing voltage 202) and outputs a comparison signal 602 to the delay circuit U302, and in response, the delay circuit U302 generates and outputs a bleeder control signal bleeder_off (e.g., the control signal 232). For example, if the bleeder control signal bleeder_off (e.g., the control signal 232) is at a logic high level, the switch SW1 is closed and the bleeder unit 220 is turned off so that the bleeder unit 220 does not generate the bleeder current 280 (e.g., the bleeder current 280 being equal to zero in magnitude). As an example, if the bleeder control signal bleeder_off (e.g., the control signal 232) is at a logic low level, the switch SW1 is open and the bleeder unit 220 is turned on so that the bleeder unit 220 generates the bleeder current 280 (e.g., the bleeder current 280 being larger than zero in magnitude). In certain examples, the system 200 determines the magnitude of the current 282 by sensing the voltage $V_{sense}$ across the sensing resistor R1 of the constant current unit 210 as shown in FIG. 2. Although the above has been shown using a selected group of components for the bleeder control unit, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the comparator U301 compares the reference voltage $V_{ref3}$ and the sensing voltage $V_{sense}$. For example, if the current 282 generated by the constant current unit 210 is greater than the holding current of the TRIAC dimmer 290, when $V_{sense}$ becomes larger than $V_{ref3}$ in magnitude, the delay circuit U302 generates the bleeder control signal bleeder_off (e.g., the control signal 232) at the logic high level to turn off the bleeder unit 220 so that the bleeder current 280 is equal to zero in magnitude. As an example, if the current 282 generated by the constant current unit 210 is less than the holding current of the TRIAC dimmer 290, when $V_{sense}$ becomes smaller than $V_{ref3}$ in magnitude, the delay circuit U302, after the constant delay td (e.g., a predetermined delay time duration), generates the bleeder control signal bleeder_off (e.g., the control signal 232) at the logic low level to turn on the bleeder unit 220 so that the bleeder current 280 is larger than zero in magnitude. In certain examples, the LED lighting system 200 that includes the bleeder control unit 230 as shown in FIG. 6 operates according to FIG. 5. In some examples, the reference voltage $V_{ref3}$ is smaller than the reference voltage $V_{ref1}$ of the constant current unit 210.

As shown in FIG. 6, the bleeder control unit (e.g., the bleeder control unit 230) includes the comparator U301 and the delay circuit U302. In some examples, the delay circuit U302 does not provide any delay if the comparison signal 602 changes from the logic low to the logic high level so that the bleeder current 280 becomes zero in magnitude without delay (e.g., at time t1 and/or at time t5 as shown in FIG. 5).

In certain examples, the delay circuit U302 provides a delay if the comparison signal 602 changes from the logic high to the logic low level so that the bleeder current 280 becomes larger than zero in magnitude after delay (e.g., at time t3 after a predetermined delay time duration as shown in FIG. 5). For example, the delay circuit U302 is configured to provide the predetermined delay time duration (e.g., the constant delay td), so that as shown in FIG. 5, from time t2 to time t3, the bleeder control signal bleeder_off (e.g., the control signal 232) remains at the logic high level and the bleeder current 280 remains equal to zero in magnitude.

As discussed above and further emphasized here, FIGS. 2 and 5 are merely examples, which should not unduly limit the scope of the claims. In some examples, the time duration from time t2 to time t3 (e.g., a delay td) is not a predetermined constant. In certain examples, the time duration from time t2 to time t3 (e.g., a delay td) is determined by detecting the input voltage VIN.

Figure 7:
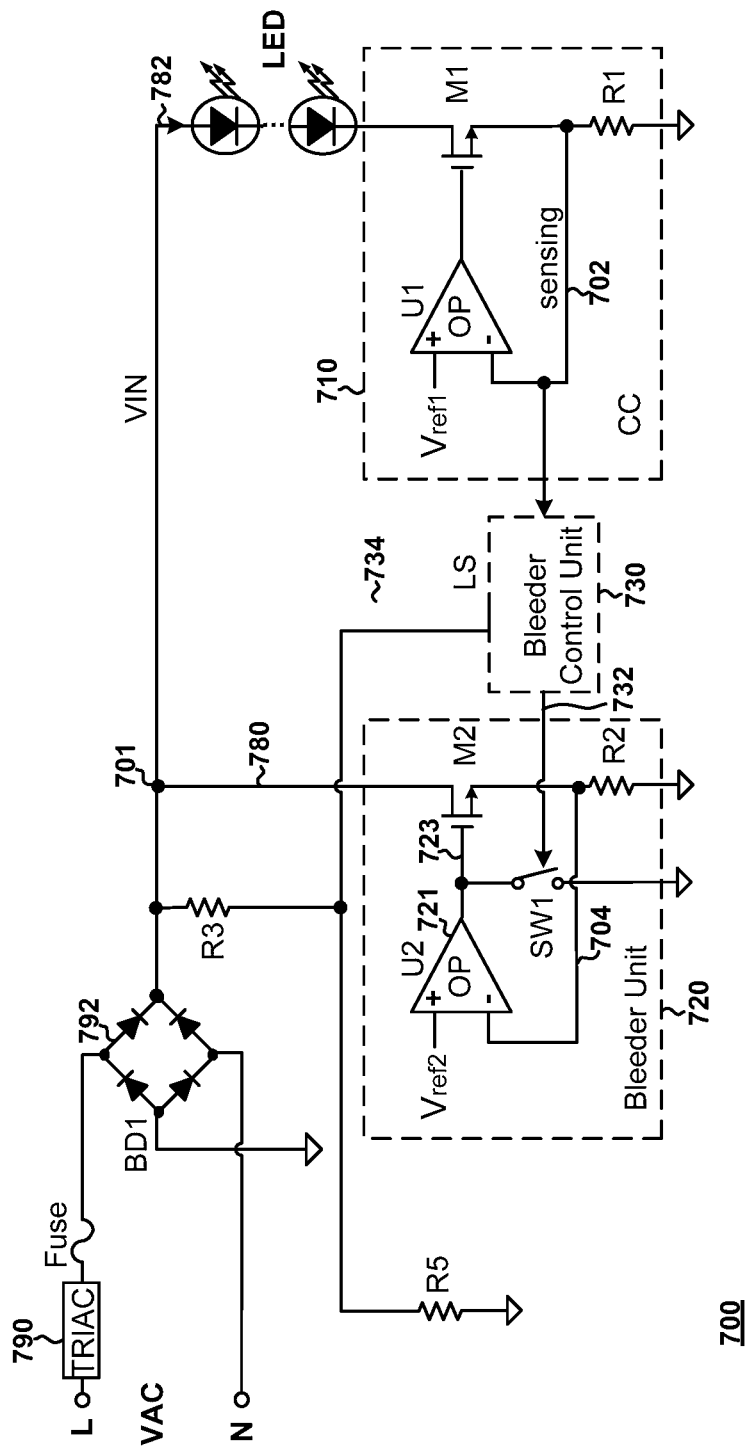
FIG. 7 is a simplified circuit diagram showing an LED lighting system with a TRIAC dimmer according to certain embodiments of the present invention.

FIG. 7 is a simplified circuit diagram showing an LED lighting system with a TRIAC dimmer according to certain embodiments of the present invention. This diagram is merely an example, which should not unduly limit the scope of the claims. One of ordinary skill in the art would recognize many variations, alternatives, and modifications. As shown in FIG. 7, the controller of the system 700 includes a constant current (CC) unit 710 (e.g., a current generator), a bleeder unit 720 (e.g., a bleeder), and a bleeder control unit 730 (e.g., a controller). In some examples, the system 700 includes a line (L) terminal and a neutral (N) terminal. For example, an AC input voltage (e.g., VAC) is received by a TRIAC dimmer 790 and also rectified (e.g., by a full wave rectifying bridge 792) to generate a rectified voltage 701 (e.g., VIN). As an example, the full wave rectifying bridge 792 is coupled to the TRIAC dimmer 790 through a fuse. For example, the rectified voltage 701 does not fall below the ground voltage of the chip (e.g., zero volt). In certain examples, the constant current unit 710 includes a transistor M1 for power regulation, a sensing resistor R1, and an amplifier U1 (e.g., an error amplifier). As an example, the source of the transistor M1 for power regulation is connected to the sensing resistor R1, the gate of the transistor M1 for power regulation is connected to an output terminal of the amplifier U1, and the drain of the transistor M1 for power regulation is connected to a cathode of an LED. Although the above has been shown using a selected group of components for the LED lighting system, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 7, the bleeder unit 720 includes an amplifier 721 (e.g., an error amplifier), a transistor M2 for power regulation, a resistor R2, and a switch SW1 according to certain embodiments. In some embodiments, one terminal of the resistor R2 is grounded, and another terminal of the resistor R2 is connected to the amplifier 721 to provide a sensing voltage 704 as an input. In certain embodiments, the amplifier 721 generates a signal 723 based on the sensing voltage 704 across the resistor R2 and a reference voltage $V_{ref2}$, and outputs the signal 723 to control the transistor M2 for power regulation if the switch SW1 is open.

For example, if the switch SW1 is closed, the bleeder unit 720 is turned off and/or stops working (e.g., the bleeder current 780 being equal to zero in magnitude). As an example, if the switch SW1 is open, the bleeder unit 720 is turned on, generating the bleeder current (e.g., $I_{bleed}$) as determined by Equation 6:

$$I_{bleed}=V_{ref2}/R_2 \qquad \text{(Equation 6)}$$

where $V_{ref2}$ represents the reference voltage received by the amplifier 721, and $R_2$ represents the resistance of the resistor R2.

According to some embodiments, the bleeder control unit 730 is configured to detect a change in a current 782 by receiving a sensing voltage $V_{sense}$ (e.g., a sensing voltage 702), and the current 782 is generated by the constant current unit 710. In some examples, the bleeder control unit 730 also includes an input terminal LS for receiving a voltage 734 generated by a voltage divider. For example, the voltage divider includes resistors R3 and R5 and is biased between the rectified voltage VIN (e.g., the rectified voltage 701) and the ground voltage, where one terminal of the resistor R3 is biased at the rectified voltage VIN and one terminal of the resistor R5 is biased at the ground voltage. As an example, the bleeder control unit 730 is further configured to detect a change in the rectified voltage VIN (e.g., the rectified voltage 701) by sensing the voltage 734. In certain examples, the current 782 (e.g., $I_{led}$) flows through the LED and into the constant current unit 710.

In certain examples, if the current 782 generated by the constant current unit 710 satisfies a first condition (e.g., when the current 782 is greater than a first threshold current), the bleeder control unit 730 (e.g., with or without a delay) turns off the bleeder unit 720 so that the bleeder unit 720 stops generating the bleeder current 780 (e.g., the bleeder current 780 being equal to zero in magnitude). For example, the bleeder control unit 730 is configured to turn off the bleeder unit 720 by enabling (e.g., by closing) the switch SW1. In some examples, if the current 782 generated by the constant current unit 710 does not satisfy the first condition but the rectified voltage VIN (e.g., the rectified voltage 701) satisfies a second condition (e.g., when the rectified voltage 701 is greater than a second threshold voltage), the bleeder control unit 730 (e.g., with or without a delay) still turns off the bleeder unit 720 so that the bleeder unit 720 still does not generate the bleeder current 780 (e.g., the bleeder current 780 being equal to zero in magnitude). In certain examples, if the current 782 generated by the constant current unit 710 does not satisfy the first condition and the rectified voltage VIN (e.g., the rectified voltage 701) does not satisfy the second condition, the bleeder control unit 230 (e.g., with or without a delay) turns on the bleeder unit 720 so that the bleeder unit 720 generates the bleeder current 780 (e.g., the bleeder current 780 being larger than zero in magnitude), enabling a TRIAC dimmer 790 to operate normally. For example, the bleeder control unit 730 is configured to turn on the bleeder unit 720 by disabling (e.g., by opening) the switch SW1.

According to certain embodiments, the bleeder control unit 730 is configured to generate a control signal 732 to turn off the bleeder unit 720 (e.g., with or without a delay) if the sensing voltage 702 satisfies the first condition (e.g., when the sensing voltage 702 is greater than a first threshold voltage). According to some embodiments, the bleeder control unit 730 is configured to generate the control signal 732 to turn on the bleeder unit 720 to generate the current 780 (e.g., with or without a delay) if the sensing voltage 702 does not satisfy the first condition and the rectified voltage VIN (e.g., the rectified voltage 701) does not satisfy the second condition (e.g., the second condition being satisfied when the rectified voltage 701 is greater than a second threshold voltage).

In some embodiments, the constant current (CC) unit 710 samples the peak amplitude of the sensing voltage 702 during each AC cycle, and transmits the sampled peak amplitude to the amplifier U1 of the constant current unit 710. As an example, the amplifier U1 of the constant current unit 710 also receives a reference voltage $V_{ref1}$ and processes the sensing voltage 702 on a cycle-by-cycle basis.

In certain embodiments, as shown in FIG. 7, the transistor M1 for power regulation is a field effect transistor (e.g., a metal-oxide-semiconductor field effect transistor (MOSFET)). For example, the transistor M1 for power regulation is an insulated gate bipolar transistor (IGBT). As an example, the transistor M1 for power regulation is a bipolar junction transistor. In some examples, the controller of the system 200 includes more or less components. In certain examples, the value of a reference voltage (e.g., the reference voltage $V_{ref1}$ and/or the reference voltage $V_{ref2}$) can be set as desired by those skilled in the art.

As discussed above and further emphasized here, FIG. 7 is merely an example, which should not unduly limit the scope of the claims. For example, the system 700 is configured to provide dimming control to one or more LEDs. As an example, multiple LEDs are connected in series.

Figure 8:
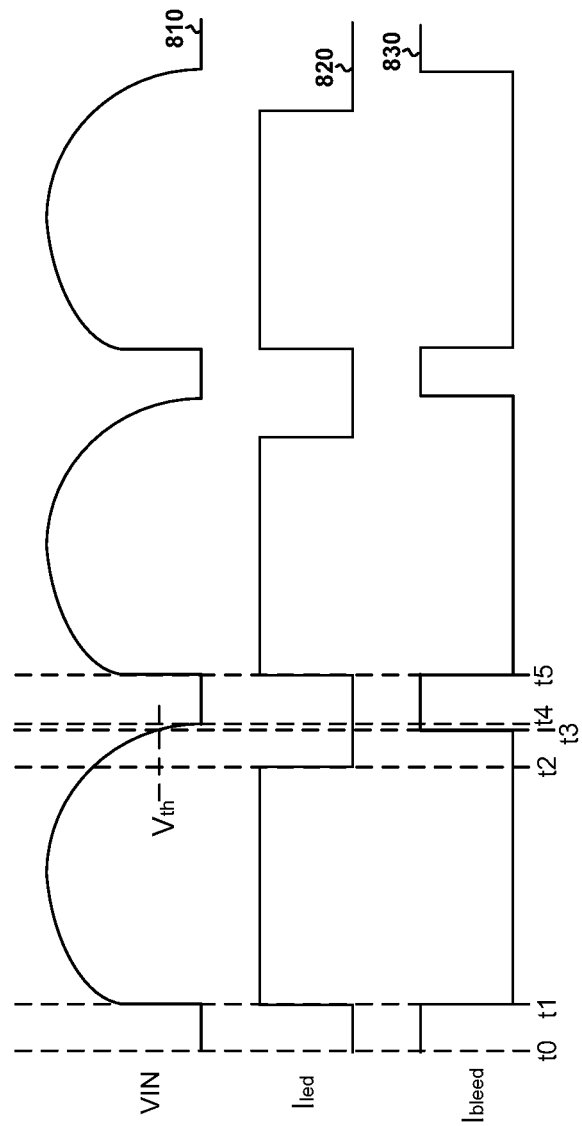
FIG. 8 shows simplified timing diagrams for controlling the LED lighting system 700 as shown in FIG. 7 according to one embodiment of the present invention.

FIG. 8 shows simplified timing diagrams for controlling the LED lighting system 700 as shown in FIG. 7 according to one embodiment of the present invention. These diagrams are merely examples, which should not unduly limit the scope of the claims. One of ordinary skill in the art would recognize many variations, alternatives, and modifications. The waveform 810 represents the rectified voltage VIN (e.g., the rectified voltage 701) as a function of time, the waveform 820 represents the LED current $I_{led}$ (e.g., the current 782) as a function of time, and the waveform 830 represents the bleeder current $I_{bleed}$ (e.g., the bleeder current 780) as a function of time. According to some embodiments, the time period from time t0 to time t4 represents a half cycle of the AC input voltage (e.g., VAC). For example, the time period from time t0 to time t4 is equal to half a period of the AC input voltage (e.g., VAC). According to certain embodiments, the time period from time t1 to time t5 represents a half cycle of the AC input voltage (e.g., VAC). As an example, the time period from time t1 to time t5 is equal to half a period of the AC input voltage (e.g., VAC).

In some embodiments, from time t0 to time t1 (e.g., when the system 700 operates normally and the AC input voltage is clipped by the TRIAC dimmer 790), the rectified voltage 701 (e.g., VIN) is small in magnitude (e.g., close to 0V), and the constant current unit 710 is not able to generate the current 782 (e.g., the current 782 being equal to zero in magnitude). For example, from time t0 to time t1, the current 782 is equal to zero in magnitude due to the clipping effect of the TRIAC dimmer 790 as shown by the waveforms 810 and 820. As an example, from time t0 to time t1, the bleeder unit 720 is turned-on, generating the bleeder current 780 (e.g., the bleeder current 780 being larger than zero in magnitude), as shown by the waveform 830. In certain embodiments, from time t1 to time t4, the system 700 operates normally and the AC input voltage (e.g., VAC) is not clipped by the TRIAC dimmer 790. In some examples, from time t1 to time t2, the rectified voltage 701 (e.g., VIN) is sufficiently large in magnitude, and the constant current unit 710 is able to generate the current 782 (e.g., the current 782 being larger than zero in magnitude) as shown by the waveforms 810 and 820. For example, from time t1 to time t2, the current 782 is equal to a predetermined magnitude larger than zero as shown by the waveform 820. As an example, from time t1 to time t2, the bleeder unit 720 is turned off, not generating the bleeder current 780 (e.g., the bleeder current 780 being equal to zero in magnitude), as shown by the waveform 830.

According to some embodiments, from time t2 to time t4, the rectified voltage 701 (e.g., VIN) is not sufficiently large in magnitude, and the constant current unit 710 is not able to generate the current 782 (e.g., the current 782 being equal to zero in magnitude) as shown by the waveforms 810 and 820. For example, at time t3, the rectified voltage 701 (e.g., VIN) becomes smaller than a threshold voltage (e.g., $V_{th}$). In some examples, from time t2 to time t3, the bleeder unit 720 remains turned off, not generating the bleeder current 780 (e.g., the bleeder current 780 being equal to zero in magnitude), as shown by the waveform 830. For example, the time duration from time t2 to time t3 is represented by a delay td (e.g., not a predetermined constant). As an example, from time t2 to time t3, the bleeder current 780 remains equal to zero in magnitude to reduce the power consumption of the bleeder current 280. In certain examples, from time t3 to time t4, the rectified voltage 701 (e.g., VIN) remains not sufficiently large in magnitude, and the constant current unit 710 remains not able to generate the current 782 (e.g., the current 782 being equal to zero in magnitude) as shown by the waveforms 810 and 820. As an example, from time t3 to time t4, the bleeder unit 720 is turned-on, generating the bleeder current 780 (e.g., the bleeder current 780 being larger than zero in magnitude), as shown by the waveform 830. For example, the rectified voltage 701 (e.g., VIN) from time t3 to time t4 is smaller than the rectified voltage 701 (e.g., VIN) from time t2 to time t3, so the power consumption by the non-zero bleeder current 780 from time t3 to time t4 is also smaller than the power consumption of the bleeder current 780 from time t2 to time t3 if the same non-zero bleeder current 780 were generated from time t2 to time t3.

According to certain embodiments, from time t4 to time t5, the system 700 operates normally and the AC input voltage (e.g., VAC) is clipped by the TRIAC dimmer 790 as shown by the waveform 810. For example, from time t4 to time t5, the constant current unit 710 is unable to generate the current 782 (e.g., the current 782 being equal to zero in magnitude), as shown by the waveform 820. As an example, from time t4 to time t5, the bleeder unit 720 is turned-on, generating the bleeder current 780 (e.g., the bleeder current 780 being larger than zero in magnitude), as shown by the waveform 830.

Figure 9:
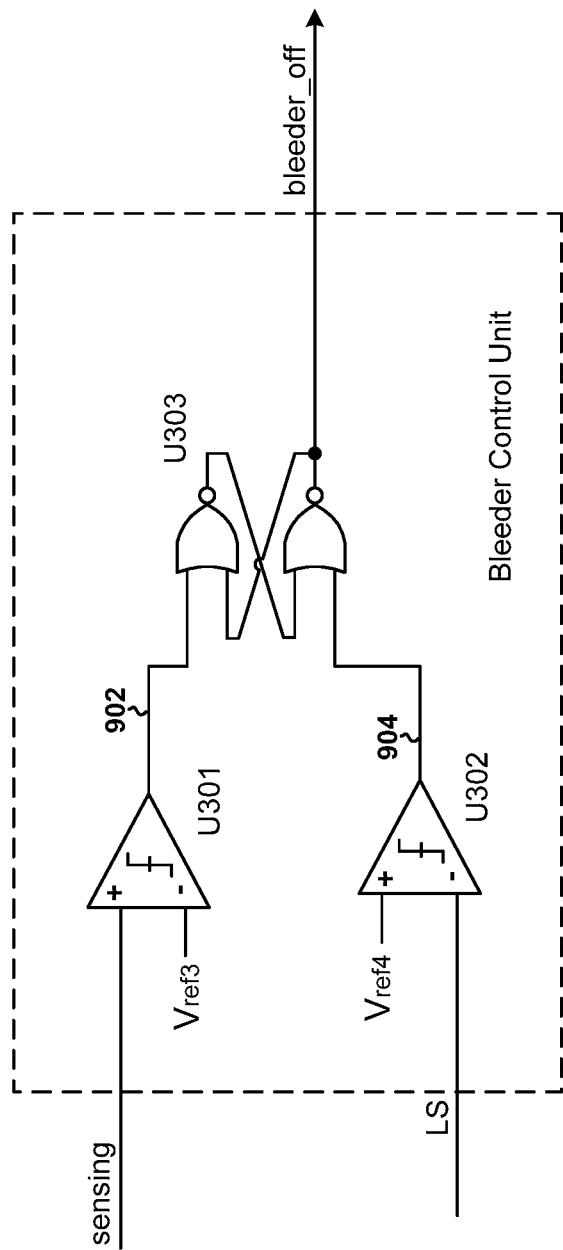
FIG. 9 is a simplified circuit diagram showing a bleeder control unit of an LED lighting system with a TRIAC dimmer (e.g., the bleeder control unit of the LED lighting system as shown in FIGS. 7 and 8) according to one embodiment of the present invention.

FIG. 9 is a simplified circuit diagram showing a bleeder control unit of an LED lighting system with a TRIAC dimmer (e.g., the bleeder control unit 730 of the LED lighting system 700 as shown in FIGS. 7 and 8) according to one embodiment of the present invention. This diagram is merely an example, which should not unduly limit the scope of the claims. One of ordinary skill in the art would recognize many variations, alternatives, and modifications. As shown in FIG. 9, the bleeder control unit (e.g., the bleeder control unit 730) includes comparators U301 and U302 and a flip-flop U303.

In some examples, the comparator U301 receives a reference voltage $V_{ref3}$ and a sensing voltage $V_{sense}$ (e.g., the sensing voltage 702) and outputs a comparison signal 902, and the comparator U302 receives the voltage 734 and a reference voltage $V_{ref4}$ and outputs a comparison signal 904. For example, the voltage 734 represents the rectified voltage 701 (e.g., the voltage 734 being equal to the rectified voltage 701 multiplied by a constant), and the reference voltage $V_{ref4}$ represents the threshold voltage (e.g., $V_{th}$) as shown in FIG. 8. As an example, if the voltage 734 becomes larger than the reference voltage $V_{ref4}$, the rectified voltage 701 becomes larger than the threshold voltage (e.g., $V_{th}$). For example, if the voltage 734 becomes smaller than the reference voltage $V_{ref4}$, the rectified voltage 701 becomes smaller than the threshold voltage (e.g., $V_{th}$). In certain examples, the flip-flop U303 receives the comparison signals 902 and 904, and in response, generates and outputs a bleeder control signal bleeder_off (e.g., the control signal 732). For example, if the bleeder control signal bleeder_off (e.g., the control signal 732) is at a logic high level, the switch SW1 is closed and the bleeder unit 720 is turned off so that the bleeder unit 720 does not generate the bleeder current 780 (e.g., the bleeder current 780 being equal to zero in magnitude). As an example, if the bleeder control signal bleeder_off (e.g., the control signal 732) is at a logic low level, the switch SW1 is open and the bleeder unit 720 is turned on so that the bleeder unit 720 generates the bleeder current 780 (e.g., the bleeder current 780 being larger than zero in magnitude). In some examples, the system 700 determines the magnitude of the current 782 by sensing the voltage $V_{sense}$ across the sensing resistor R1 of the constant current unit 710 as shown in FIG. 7. Although the above has been shown using a selected group of components for the bleeder control unit, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

In some embodiments, the comparator U301 compares the reference voltage $V_{ref3}$ and the sensing voltage $V_{sense}$ (e.g., the sensing voltage 702). For example, if the current 782 generated by the constant current unit 710 is greater than the holding current of the TRIAC dimmer 790, when the sensing voltage $V_{sense}$ becomes larger than the reference voltage $V_{ref3}$ in magnitude, the flip-flop U303 generates the bleeder control signal bleeder_off (e.g., the control signal 732) at the logic high level to turn off the bleeder unit 720 so that the bleeder current 780 is equal to zero in magnitude. As an example, if the current 782 generated by the constant current unit 710 is less than the holding current of the TRIAC dimmer 790, when the sensing voltage $V_{sense}$ is smaller than the reference voltage $V_{ref3}$ in magnitude and the voltage 734 becomes smaller than the reference voltage $V_{ref4}$ in magnitude, the flip-flop U303 generates the bleeder control signal bleeder_off (e.g., the control signal 732) at the logic low level to turn on the bleeder unit 720 so that the bleeder current 780 is larger than zero in magnitude.

In some examples, the LED lighting system 700 that includes the bleeder control unit 730 as shown in FIG. 9 operates according to FIG. 8. In certain examples, the reference voltage $V_{ref3}$ is smaller than the reference voltage $V_{ref1}$ of the constant current unit 710.

As shown in FIG. 9, in certain embodiments, when the voltage 734 becomes smaller than the reference voltage $V_{ref4}$ in magnitude, the flip-flop U303 generates the bleeder control signal bleeder_off (e.g., the control signal 732) at the logic low level to turn on the bleeder unit 720 so that the bleeder current 780 is larger than zero in magnitude.

As discussed above and further emphasized here, FIGS. 7 and 8 are merely examples, which should not unduly limit the scope of the claims. In some embodiments, the time duration from time t2 to time t3 (e.g., a delay td) is not a predetermined constant. In certain embodiments, the time duration from time t2 to time t3 (e.g., a delay td) is determined by detecting a voltage generated by the TRIAC dimmer before being processed by the full wave rectifying bridge, as shown, for example, by FIG. 10.

Figure 10:
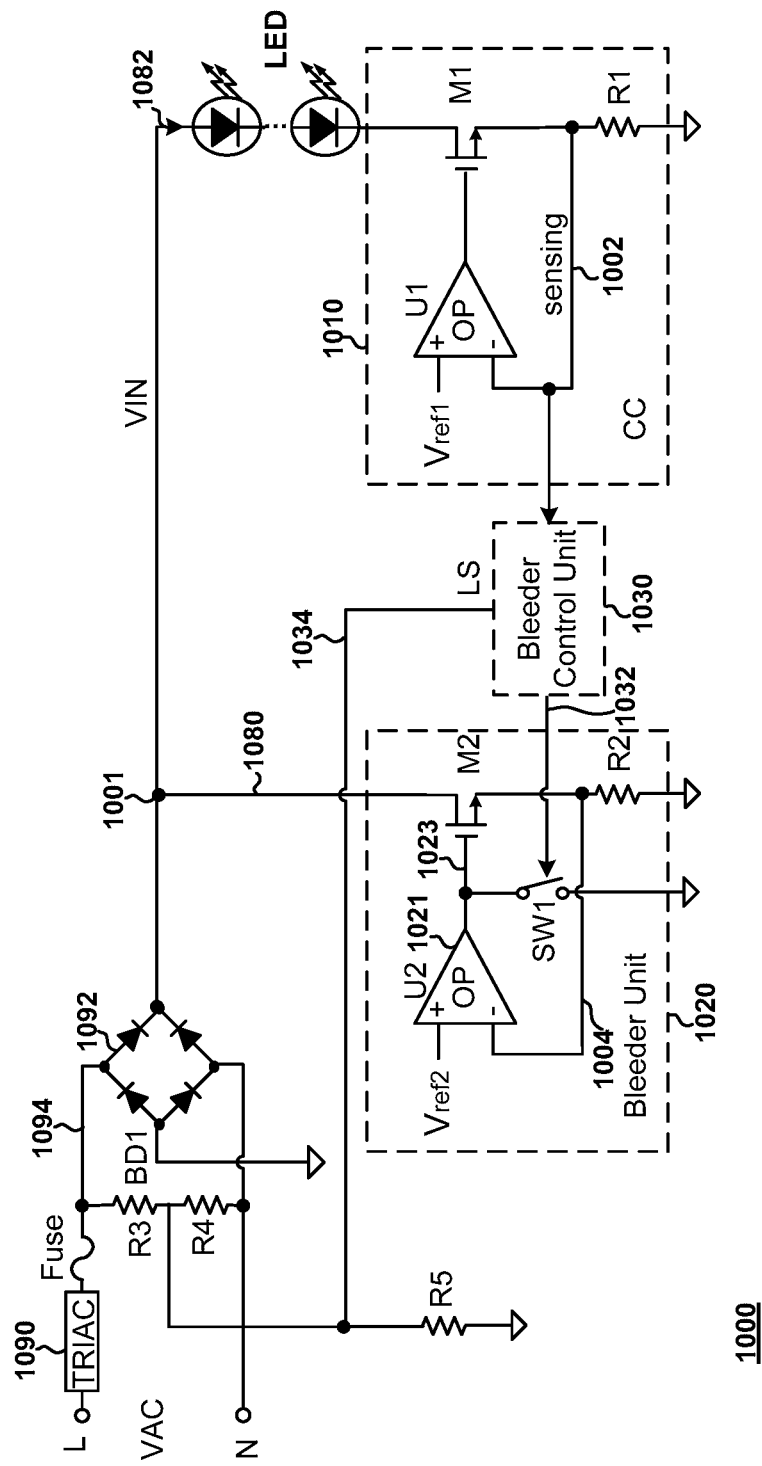
FIG. 10 is a simplified circuit diagram showing an LED lighting system with a TRIAC dimmer according to some embodiments of the present invention.

FIG. 10 is a simplified circuit diagram showing an LED lighting system with a TRIAC dimmer according to some embodiments of the present invention. This diagram is merely an example, which should not unduly limit the scope of the claims. One of ordinary skill in the art would recognize many variations, alternatives, and modifications. As shown in FIG. 10, the controller of the system 1000 includes a constant current (CC) unit 1010 (e.g., a current generator), a bleeder unit 1020 (e.g., a bleeder), and a bleeder control unit 1030 (e.g., a controller). In some examples, the system 1000 includes a line (L) terminal and a neutral (N) terminal. For example, an AC input voltage (e.g., VAC) is received by a TRIAC dimmer 1090, which generates a voltage 1094 (e.g., the TRIAC dimmer 1090 generating the voltage 1094 through a fuse). As an example, the voltage 1094 is rectified (e.g., by a full wave rectifying bridge 1092) to generate a rectified voltage 1001 (e.g., VIN). For example, the full wave rectifying bridge 1092 is coupled to the TRIAC dimmer 1090 through a fuse. As an example, the rectified voltage 1001 does not fall below the ground voltage of the chip (e.g., zero volt). In certain examples, the constant current unit 1010 includes a transistor M1 for power regulation, a sensing resistor R1, and an amplifier U1 (e.g., an error amplifier). For example, the source of the transistor M1 for power regulation is connected to the sensing resistor R1, the gate of the transistor M1 for power regulation is connected to an output terminal of the amplifier U1, and the drain of the transistor M1 for power regulation is connected to a cathode of an LED. Although the above has been shown using a selected group of components for the LED lighting system, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification.

As shown in FIG. 10, the bleeder unit 1020 includes an amplifier 1021 (e.g., an error amplifier), a transistor M2 for power regulation, a resistor R2, and a switch SW1 according to certain embodiments. In some embodiments, one terminal of the resistor R2 is grounded, and another terminal of the resistor R2 is connected to the amplifier 1021 to provide a sensing voltage 1004 as an input. In certain embodiments, the amplifier 1021 generates a signal 1023 based on the sensing voltage 1004 across the resistor R2 and a reference voltage $V_{ref2}$, and outputs the signal 1023 to control the transistor M2 for power regulation if the switch SW1 is open.

For example, if the switch SW1 is closed, the bleeder unit 1020 is turned off and/or stops working (e.g., the bleeder current 1080 being equal to zero in magnitude). As an example, if the switch SW1 is open, the bleeder unit 1020 is turned on, generating the bleeder current (e.g., $I_{bleed}$) as determined by Equation 7:

$$I_{bleed} = V_{ref2}/R_2 \quad \text{(Equation 7)}$$

where $V_{ref2}$ represents the reference voltage received by the amplifier 1021, and $R_2$ represents the resistance of the resistor R2.

According to some embodiments, the bleeder control unit 1030 is configured to detect a change in a current 1082 by receiving a sensing voltage $V_{sense}$ (e.g., a sensing voltage 1002), and the current 1082 is generated by the constant current unit 1010. In some examples, the bleeder control unit 1030 also includes an input terminal LS for receiving a voltage 1034 generated by a combination of resistors R3, R4, and R5. For example, the resistors R3, R4, and R5 are parts of a voltage divider. As an example, the resistor R3 is configured to receive the voltage 1094, and another terminal of the resistor R3 is connected to one terminal of the resistor R4 and one terminal of the resistor R5. For example, the one terminal of the resistor R5 is configured to provide the voltage 1034. As an example, another terminal of the resistor R5 is biased to the ground voltage, and another terminal of the resistor R4 is connected to the N terminal of the system 1000. In certain examples, the bleeder control unit 1030 is further configured to detect a change in the voltage 1094 by sensing the voltage 1034. In some examples, the current 1082 (e.g., $I_{led}$) flows through the LED into the constant current unit 1010.

In certain examples, if the current 1082 generated by the constant current unit 1010 satisfies a first condition (e.g., when the current 1082 is greater than a first threshold current), the bleeder control unit 1030 (e.g., with or without a delay) turns off the bleeder unit 1020 so that the bleeder unit 1020 stops generating the bleeder current 1080 (e.g., the bleeder current 1080 being equal to zero in magnitude). For example, the bleeder control unit 1030 is configured to turn off the bleeder unit 1020 by enabling (e.g., by closing) the switch SW1. In some examples, if the current 1082 generated by the constant current unit 1010 does not satisfy the first condition but the voltage 1094 satisfies a second condition (e.g., when the voltage 1094 is greater than a second threshold voltage), the bleeder control unit 1030 (e.g., with or without a delay) still turns off the bleeder unit 1020 so that the bleeder unit 1020 still does not generate the bleeder current 1080 (e.g., the bleeder current 1080 being equal to zero in magnitude). In certain examples, if the current 1082 generated by the constant current unit 1010 does not satisfy the first condition and the voltage 1094 does not satisfy the second condition, the bleeder control unit 1030 (e.g., with or without a delay) turns on the bleeder unit 1020 so that the bleeder unit 1020 generates the bleeder current 1080 (e.g., the bleeder current 1080 being larger than zero in magnitude), enabling a TRIAC dimmer 1090 to operate normally. For example, the bleeder control unit 1030 is configured to turn on the bleeder unit 1020 by disabling (e.g., by opening) the switch SW1.

According to certain embodiments, the bleeder control unit 1030 is configured to generate a control signal 1032 to turn off the bleeder unit 1020 (e.g., with or without a delay) if the sensing voltage 1002 satisfies the first condition (e.g., when the sensing voltage 1002 is greater than a first threshold voltage). According to some embodiments, the bleeder control unit 1030 is configured to generate the control signal 1032 to turn on the bleeder unit 1020 to generate the current 1080 (e.g., with or without a delay) if the sensing voltage 1002 does not satisfy the first condition and the voltage 1094 does not satisfy the second condition (e.g., the second condition being satisfied when the voltage 1094 is greater than a second threshold voltage).

In some embodiments, the constant current (CC) unit 1010 samples the peak amplitude of the sensing voltage 1002 during each AC cycle, and transmits the sampled peak amplitude to the amplifier U1 of the constant current unit 1010. As an example, the amplifier U1 of the constant current unit 1010 also receives a reference voltage $V_{ref1}$ and processes the sensing voltage 1002 on a cycle-by-cycle basis.

In certain embodiments, as shown in FIG. 10, the transistor M1 for power regulation is a field effect transistor (e.g., a metal-oxide-semiconductor field effect transistor (MOSFET)). For example, the transistor M1 for power regulation is an insulated gate bipolar transistor (IGBT). As an example, the transistor M1 for power regulation is a bipolar junction transistor. In some examples, the controller of the system 200 includes more or less components. In certain examples, the value of a reference voltage (e.g., the reference voltage $V_{ref1}$ and/or the reference voltage $V_{ref2}$) can be set as desired by those skilled in the art.

According to some embodiments, simplified timing diagrams for controlling the LED lighting system 1000 are shown in FIG. 8, if the waveform 810 represents the voltage 1094 as a function of time, the waveform 820 represents the LED current $I_{led}$ (e.g., the current 1082) as a function of time, and the waveform 830 represents the bleeder current $I_{bleed}$ (e.g., the bleeder current 1080) as a function of time. According to certain embodiments, the bleeder control unit 1030 of the LED lighting system 1000 is shown in FIG. 9, where the comparator U301 receives a reference voltage $V_{ref3}$ and a sensing voltage $V_{sense}$ (e.g., the sensing voltage 1002), the comparator U302 receives the voltage 1034 and a reference voltage $V_{ref4}$, and the flip-flop U303 generates and outputs a bleeder control signal bleeder_off (e.g., the control signal 1032).

As discussed above and further emphasized here, FIG. 10 is merely an example, which should not unduly limit the scope of the claims. For example, the system 1000 is configured to provide dimming control to one or more LEDs. As an example, multiple LEDs are connected in series.

In some embodiments, an LED switch control system includes a constant current control unit, a bleeder unit, a bleeder control unit, and a rectifier unit. For example, the constant current control unit is coupled to a transistor and configured to output a first current. As an example, the bleeder unit is coupled to a system input and the bleeder control unit. For example, the bleeder control unit is coupled to the constant current control unit and the bleeder unit and configured to receive a sensing signal. As an example, the rectifier unit is configured to rectify and filter an input voltage of the system and transmit a rectified voltage to the bleeder unit and the constant current control unit. For example, the bleeder control unit is configured to generate a control signal to disable the bleeder unit when the sensing signal satisfies a first condition and to generate the control signal to enable the bleeder unit to output a bleeding current when the sensing signal does not satisfy the first condition.

According to certain embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator and output a control signal to the bleeder. The sensing voltage indicates a magnitude of the first current. The controller is further configured to generate the control signal to turn off the bleeder if the sensing voltage satisfies a first condition so that the bleeder does not generate a second current, and generate the control signal to turn on the bleeder if the sensing signal satisfies a second condition so that the bleeder generates the second current. The second current is larger than zero in magnitude. The second condition is different from the first condition. For example, the system is implemented according to at least FIG. 2, FIG. 3, FIG. 4, FIG. 5, and/or FIG. 6.

As an example, the first condition is the sensing voltage being larger than a reference voltage in magnitude, and the second condition is the sensing voltage being smaller than the reference voltage in magnitude. For example, the controller includes a comparator configured to receive the sensing voltage and a reference voltage, and the controller is further configured to change the control signal to turn off the bleeder in response to the sensing voltage becoming larger than the reference voltage in magnitude. As an example, the controller is further configured to change the control signal to turn on the bleeder in response to the sensing voltage becoming smaller than the reference voltage in magnitude. For example, the controller is further configured to change the control signal to turn on the bleeder, without a delay, in response to the sensing voltage becoming smaller than the reference voltage in magnitude. As an example, the controller is further configured to change the control signal to turn on the bleeder, with a delay, in response to the sensing voltage becoming smaller than the reference voltage in magnitude. For example, the delay is a predetermined time duration. As an example, the delay is not a predetermined time duration.

For example, the controller is further configured to: generate the control signal at a first logic level from a first time to a second time, during which the sensing voltage is smaller than a reference voltage in magnitude; generate the control signal at a second logic level from the second time to a third time, during which the sensing voltage is larger than the reference voltage in magnitude; and generate the control signal at the first logic level from the third time to a fourth time, during which the sensing voltage is smaller than the reference voltage in magnitude; wherein the first logic level and the second logic level are different. As an example, the control signal at the first logic level is configured to turn on the bleeder so that the bleeder generates the second current, and the control signal at the second logic level is configured to turn off the bleeder so that the bleeder does not generate the second current.

For example, the controller includes a comparator configured to receive the sensing voltage and a reference voltage and generate a comparison signal based at least in part on the sensing voltage and the reference voltage, and a control signal generator configured to receive the comparison and generate the control signal based at least in part on the comparison signal. As an example, the control signal generator is further configured to change the control signal to turn on the bleeder, with a predetermined delay, in response to the sensing voltage becoming smaller than the reference voltage in magnitude. For example, the controller is further configured to: generate the control signal at a first logic level from a first time to a second time, during which the sensing voltage is smaller than the reference voltage in magnitude; generate the control signal at a second logic level from the second time to a third time, during which the sensing voltage is larger than the reference voltage in magnitude; generate the control signal at the second logic level from the third time to a fourth time, during which the sensing voltage is smaller than the reference voltage in magnitude; and generate the control signal at the first logic level from the fourth time to a fifth time, during which the sensing voltage is smaller than the reference voltage in magnitude; wherein: the first logic level and the second logic level are different; and a time duration from the third time to the fourth time is equal to the predetermined delay in magnitude. As an example, the rectifying bridge is coupled to the TRIAC dimmer through a fuse.

According to some embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator, receive an input voltage generated by a voltage divider, and output a control signal to the bleeder. The sensing voltage indicates a magnitude of the first current, the voltage divider is configured to receive the rectified voltage, and the input voltage indicates a magnitude of the rectified voltage. The controller is further configured to generate the control signal to turn off the bleeder if the sensing voltage and the input voltage satisfy a first condition so that the bleeder does not generate a second current, and generate the control signal to turn on the bleeder if the sensing signal and the input voltage satisfy a second condition so that the bleeder generates the second current. The second current is larger than zero in magnitude. The second condition is different from the first condition. For example, the system is implemented according to at least FIG. 7, FIG. 8, and/or FIG. 9.

As an example, the voltage divider includes multiple resistors connected in series and biased between the rectified voltage and a ground voltage. For example, the controller is further configured to: generate the control signal at a first logic level from a first time to a second time, during which the sensing voltage is smaller than a first reference voltage in magnitude and the input voltage is smaller than a second reference voltage in magnitude; generate the control signal at a second logic level from the second time to a third time, during which the sensing voltage is larger than the first reference voltage in magnitude and the input voltage is larger than the second reference voltage in magnitude; generate the control signal at the second logic level from the third time to a fourth time, during which the sensing voltage is smaller than the first reference voltage in magnitude and the input voltage is larger than the second reference voltage in magnitude; and generate the control signal at the first logic level from the fourth time to a fifth time, during which the sensing voltage is smaller than the first reference voltage in magnitude and the input voltage is smaller than the second reference voltage in magnitude; wherein the first logic level and the second logic level are different. As an example, the controller is further configured to the control signal at the first logic level is configured to turn on the bleeder so that the bleeder generates the second current, and the control signal at the second logic level is configured to turn off the bleeder so that the bleeder does not generate the second current. For example, the rectifying bridge is coupled to the TRIAC dimmer through a fuse.

According to some embodiments, a system for controlling one or more light emitting diodes includes a current generator configured to generate a first current flowing through one or more light emitting diodes. The one or more light emitting diodes is configured to receive a rectified voltage generated by a rectifying bridge coupled to a TRIAC dimmer. Additionally, the system includes a bleeder configured to receive the rectified voltage, and a controller configured to receive a sensing voltage from the current generator, the sensing voltage indicating a magnitude of the first current, receive an input voltage generated by a voltage divider, the voltage divider being configured to receive the rectified voltage, the input voltage indicating a magnitude of the rectified voltage, and output a control signal to the bleeder. The controller is further configured to generate the control signal to turn off the bleeder if the input voltage satisfies a first condition so that the bleeder does not generate a second current, and generate the control signal to turn on the bleeder if the input voltage satisfies a second condition so that the bleeder generates the second current. The second current is larger than zero in magnitude. The second condition is different from the first condition. For example, the system is implemented according to at least FIG. 7, FIG. 8, and/or FIG. 9.

As an example, the controller is further configured to: generate the control signal at a first logic level from a first time to a second time, during which the input voltage is smaller than a reference voltage in magnitude; generate the control signal at a second logic level from the second time to a third time, during which the input voltage is larger than the reference voltage in magnitude; and generate the control signal at the first logic level from the third time to a fourth time, during which the input voltage is smaller than the reference voltage in magnitude; wherein the first logic level and the second logic level are different. For example, the control signal at the first logic level is configured to turn on the bleeder so that the bleeder generates the second current, and the control signal at the second logic level is configured to turn off the bleeder so that the bleeder does not generate the second current. As an example, the rectifying bridge is coupled to the TRIAC dimmer through a fuse.

According to certain embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator, receive an input voltage generated by a voltage divider, and output a control signal to the bleeder. The sensing voltage indicates a magnitude of the first current, the voltage divider is configured to receive a dimmer output voltage generated by the TRIAC dimmer and received by the rectifying bridge, and the input voltage indicating a magnitude of the dimmer output voltage. The controller is further configured to generate the control signal to turn off the bleeder if the sensing voltage and the input voltage satisfy a first condition so that the bleeder does not generate a second current, and generate the control signal to turn on the bleeder if the sensing signal and the input voltage satisfy a second condition so that the bleeder generates the second current. The second current is larger than zero in magnitude. The second condition is different from the first condition. For example, the system is implemented according to at least FIG. 10.

As an example, the controller is further configured to: generate the control signal at a first logic level from a first time to a second time, during which the sensing voltage is smaller than a first reference voltage in magnitude and the input voltage is smaller than a second reference voltage in magnitude; generate the control signal at a second logic level from the second time to a third time, during which the sensing voltage is larger than the first reference voltage in magnitude and the input voltage is larger than the second reference voltage in magnitude; generate the control signal at the second logic level from the third time to a fourth time, during which the sensing voltage is smaller than the first reference voltage in magnitude and the input voltage is larger than the second reference voltage in magnitude; and generate the control signal at the first logic level from the fourth time to a fifth time, during which the sensing voltage is smaller than the first reference voltage in magnitude and the input voltage is smaller than the second reference voltage in magnitude; wherein the first logic level and the second logic level are different. For example, the control signal at the first logic level is configured to turn on the bleeder so that the bleeder generates the second current, and the control signal at the second logic level is configured to turn off the bleeder so that the bleeder does not generate the second current. As an example, the rectifying bridge is coupled to the TRIAC dimmer through a fuse.

According to some embodiments, a system for controlling one or more light emitting diodes includes a current generator configured to generate a first current flowing through one or more light emitting diodes. The one or more light emitting diodes are configured to receive a rectified voltage generated by a rectifying bridge coupled to a TRIAC dimmer. Additionally, the system includes a bleeder configured to receive the rectified voltage, and a controller configured to receive a sensing voltage from the current generator, receive an input voltage generated by a voltage divider, and output a control signal to the bleeder. The sensing voltage indicates a magnitude of the first current, the voltage divider is configured to receive a dimmer output voltage generated by the TRIAC dimmer and received by the rectifying bridge, and the input voltage indicates a magnitude of the dimmer output voltage. The controller is further configured to generate the control signal to turn off the bleeder if the input voltage satisfies a first condition so that the bleeder does not generate a second current, and generate the control signal to turn on the bleeder if the input voltage satisfies a second condition so that the bleeder generates the second current. The second current is larger than zero in magnitude. The second condition is different from the first condition. For example, the system is implemented according to at least FIG. 10.

As an example, the controller is further configured to: generate the control signal at a first logic level from a first time to a second time, during which the input voltage is smaller than a reference voltage in magnitude; generate the control signal at a second logic level from the second time to a third time, during which the input voltage is larger than the reference voltage in magnitude; and generate the control signal at the first logic level from the third time to a fourth time, during which the input voltage is smaller than the second reference voltage in magnitude; wherein the first logic level and the second logic level are different. For example, the control signal at the first logic level is configured to turn on the bleeder so that the bleeder generates the second current, and the control signal at the second logic level is configured to turn off the bleeder so that the bleeder does not generate the second current. As an example, the rectifying bridge is coupled to the TRIAC dimmer through a fuse.

According to certain embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving the rectified voltage, receiving a sensing voltage, the sensing voltage indicating a magnitude of the first current, and outputting a control signal to a bleeder. The outputting a control signal to a bleeder includes generating the control signal to turn off the bleeder if the sensing voltage satisfies a first condition so that the bleeder does not generate a second current, and generating the control signal to turn on the bleeder if the sensing signal satisfies a second condition so that the bleeder generates the second current. The second current is larger than zero in magnitude. The second condition is different from the first condition. For example, the method is implemented according to at least FIG. 2, FIG. 3, FIG. 4, FIG. 5, and/or FIG. 6.

According to some embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage, the sensing voltage indicating a magnitude of the first current, receiving an input voltage, the input voltage indicating a magnitude of the rectified voltage, and outputting a control signal to the bleeder. The outputting a control signal to the bleeder includes generating the control signal to turn off the bleeder if the sensing voltage and the input voltage satisfy a first condition so that the bleeder does not generate a second current, and generating the control signal to turn on the bleeder if the sensing signal and the input voltage satisfy a second condition so that the bleeder generates the second current. The second current is larger than zero in magnitude. The second condition is different from the first condition. For example, the method is implemented according to at least FIG. 7, FIG. 8, and/or FIG. 9.

According to certain embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage, the sensing voltage indicating a magnitude of the first current, receiving an input voltage, the input voltage indicating a magnitude of the rectified voltage, and outputting a control signal to the bleeder. The outputting a control signal to the bleeder includes generating the control signal to turn off the bleeder if the input voltage satisfies a first condition so that the bleeder does not generate a second current, and generating the control signal to turn on the bleeder if the input voltage satisfies a second condition so that the bleeder generates the second current. The second current is larger than zero in magnitude. The second condition is different from the first condition. For example, the method is implemented according to at least FIG. 7, FIG. 8, and/or FIG. 9.

According to some embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage, the sensing voltage indicating a magnitude of the first current, receiving an input voltage, the input voltage indicating a magnitude of a dimmer output voltage generated by the TRIAC dimmer and received by the rectifying bridge, and outputting a control signal to the bleeder. The outputting a control signal to the bleeder includes generating the control signal to turn off the bleeder if the sensing voltage and the input voltage satisfy a first condition so that the bleeder does not generate a second current, and generating the control signal to turn on the bleeder if the sensing signal and the input voltage satisfy a second condition so that the bleeder generates the second current. The second current is larger than zero in magnitude. The second condition is different from the first condition. For example, the method is implemented according to at least FIG. 10.

According to certain embodiments, a method for controlling one or more light emitting diodes includes generating a first current flowing through one or more light emitting diodes. The one or more light emitting diodes are configured to receive a rectified voltage generated by a rectifying bridge coupled to a TRIAC dimmer. Additionally, the method includes receiving a sensing voltage; receiving an input voltage, and outputting a control signal to the bleeder. The sensing voltage indicates a magnitude of the first current, and the input voltage indicates a magnitude of a dimmer output voltage generated by the TRIAC dimmer and received by the rectifying bridge. The outputting a control signal to the bleeder includes generating the control signal to turn off the bleeder if the input voltage satisfies a first condition so that the bleeder does not generate a second current, and generating the control signal to turn on the bleeder if the input voltage satisfies a second condition so that the bleeder generates the second current. The second current is larger than zero in magnitude. The second condition is different from the first condition. For example, the method is implemented according to at least FIG. 10.

According to certain embodiments, the present invention can be implemented in other examples without departing from one or more essential characteristics. As an example, various embodiments are to be considered in all aspects as exemplary but not limiting.

For example, some or all components of various embodiments of the present invention each are, individually and/or in combination with at least another component, implemented using one or more software components, one or more hardware components, and/or one or more combinations of software and hardware components. As an example, some or all components of various embodiments of the present invention each are, individually and/or in combination with at least another component, implemented in one or more circuits, such as one or more analog circuits and/or one or more digital circuits. For example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for controlling one or more light emitting diodes, the system comprising:
   a current generator configured to generate a first current flowing through one or more light emitting diodes, the one or more light emitting diodes being configured to receive a rectified voltage generated by a rectifying bridge coupled to a TRIAC dimmer;
   a bleeder configured to receive the rectified voltage; and
   a controller configured to:
   receive a sensing voltage from the current generator, the sensing voltage indicating a magnitude of the first current;
   receive an input voltage generated by a voltage divider, the voltage divider being configured to receive a dimmer output voltage generated by the TRIAC dimmer and received by the rectifying bridge, the input voltage indicating a magnitude of the dimmer output voltage; and
   output a control signal to the bleeder;
   wherein the controller is further configured to:
   generate the control signal to turn off the bleeder if the sensing voltage and the input voltage satisfy a first condition so that the bleeder does not generate a second current, the second current being larger than zero in magnitude; and
   generate the control signal to turn on the bleeder if the sensing signal and the input voltage satisfy a second condition so that the bleeder generates the second current;
   wherein the second condition is different from the first condition.

2. The system of claim 1 wherein the controller is further configured to:
   generate the control signal at a first logic level from a first time to a second time, during which the sensing voltage is smaller than a first reference voltage in magnitude and the input voltage is smaller than a second reference voltage in magnitude;
   generate the control signal at a second logic level from the second time to a third time, during which the sensing voltage is larger than the first reference voltage in magnitude and the input voltage is larger than the second reference voltage in magnitude;
   generate the control signal at the second logic level from the third time to a fourth time, during which the sensing voltage is smaller than the first reference voltage in magnitude and the input voltage is larger than the second reference voltage in magnitude; and
   generate the control signal at the first logic level from the fourth time to a fifth time, during which the sensing voltage is smaller than the first reference voltage in magnitude and the input voltage is smaller than the second reference voltage in magnitude;
   wherein the first logic level and the second logic level are different.

3. The system of claim 2 wherein:
   the control signal at the first logic level is configured to turn on the bleeder so that the bleeder generates the second current; and
   the control signal at the second logic level is configured to turn off the bleeder so that the bleeder does not generate the second current.

4. The system of claim 1 wherein the rectifying bridge is coupled to the TRIAC dimmer through a fuse.

5. A system for controlling one or more light emitting diodes, the system comprising:
   a current generator configured to generate a first current flowing through one or more light emitting diodes, the one or more light emitting diodes being configured to receive a rectified voltage generated by a rectifying bridge coupled to a TRIAC dimmer;
   a bleeder configured to receive the rectified voltage; and
   a controller configured to:
   receive a sensing voltage from the current generator, the sensing voltage indicating a magnitude of the first current;
   receive an input voltage generated by a voltage divider, the voltage divider being configured to receive a dimmer output voltage generated by the TRIAC dimmer and received by the rectifying bridge, the input voltage indicating a magnitude of the dimmer output voltage; and
   output a control signal to the bleeder;

wherein the controller is further configured to:
generate the control signal to turn off the bleeder if the input voltage satisfies a first condition so that the bleeder does not generate a second current, the second current being larger than zero in magnitude; and
generate the control signal to turn on the bleeder if the input voltage satisfies a second condition so that the bleeder generates the second current;
wherein the second condition is different from the first condition.

6. The system of claim 5 wherein the controller is further configured to:
generate the control signal at a first logic level from a first time to a second time, during which the input voltage is smaller than a reference voltage in magnitude;
generate the control signal at a second logic level from the second time to a third time, during which the input voltage is larger than the reference voltage in magnitude; and
generate the control signal at the first logic level from the third time to a fourth time, during which the input voltage is smaller than the second reference voltage in magnitude;
wherein the first logic level and the second logic level are different.

7. The system of claim 6 wherein:
the control signal at the first logic level is configured to turn on the bleeder so that the bleeder generates the second current; and
the control signal at the second logic level is configured to turn off the bleeder so that the bleeder does not generate the second current.

8. The system of claim 5 wherein the rectifying bridge is coupled to the TRIAC dimmer through a fuse.

9. A method for controlling one or more light emitting diodes, the method comprising:
generating a first current flowing through one or more light emitting diodes, the one or more light emitting diodes being configured to receive a rectified voltage generated by a rectifying bridge coupled to a TRIAC dimmer;
receiving, by a bleeder, the rectified voltage;
receiving, by a controller, a sensing voltage, the sensing voltage indicating a magnitude of the first current;
receiving, by the controller, an input voltage generated by a voltage divider, the voltage divider being configured to receive a dimmer output voltage generated by the TRIAC dimmer and received by the rectifying bridge, the input voltage indicating a magnitude of the dimmer output voltage; and
outputting, by the controller, a control signal to the bleeder;
wherein the outputting, by the controller, a control signal to the bleeder includes:
generating the control signal to turn off the bleeder if the sensing voltage and the input voltage satisfy a first condition so that the bleeder does not generate a second current, the second current being larger than zero in magnitude; and
generating the control signal to turn on the bleeder if the sensing signal and the input voltage satisfy a second condition so that the bleeder generates the second current;
wherein the second condition is different from the first condition.

10. A method for controlling one or more light emitting diodes, the method comprising:
generating a first current flowing through one or more light emitting diodes, the one or more light emitting diodes being configured to receive a rectified voltage generated by a rectifying bridge coupled to a TRIAC dimmer;
receiving, by a bleeder, the rectified voltage;
receiving, by a controller, a sensing voltage, the sensing voltage indicating a magnitude of the first current;
receiving, by the controller, an input voltage generated by a voltage divider, the voltage divider being configured to receive a dimmer output voltage generated by the TRIAC dimmer and received by the rectifying bridge, the input voltage indicating a magnitude of the dimmer output voltage; and
outputting, by the controller, a control signal to the bleeder;
wherein the outputting, by the controller, a control signal to the bleeder includes:
generating the control signal to turn off the bleeder if the input voltage satisfies a first condition so that the bleeder does not generate a second current, the second current being larger than zero in magnitude; and
generating the control signal to turn on the bleeder if the input voltage satisfies a second condition so that the bleeder generates the second current;
wherein the second condition is different from the first condition.

* * * * *